US012796151B2

(12) United States Patent
Yoon

(10) Patent No.: US 12,796,151 B2
(45) Date of Patent: Nov. 10, 2026

(54) IMAGE SENSOR AND MANUFACTURING METHOD OF THE SAME

(71) Applicant: Samsung Electronics Co., Ltd., Suwon-si (KR)

(72) Inventor: Sunghyun Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 247 days.

(21) Appl. No.: 18/674,109

(22) Filed: May 24, 2024

(65) Prior Publication Data

US 2025/0063843 A1 Feb. 20, 2025

(30) Foreign Application Priority Data

Aug. 16, 2023 (KR) ........................ 10-2023-0107100

(51) Int. Cl.
*H10F 39/00* (2025.01)

(52) U.S. Cl.
CPC ....... *H10F 39/811* (2025.01); *H10F 39/8057* (2025.01)

(58) Field of Classification Search
CPC .. H10F 39/811; H10F 39/8057; H10F 39/199; H10F 39/8053; H10F 39/809; H10F 39/18; H10F 39/8063; H10F 39/807
See application file for complete search history.

(56) References Cited

U.S. PATENT DOCUMENTS

| | | | | |
|---|---|---|---|---|
| 9,048,354 | B2 | 6/2015 | Park et al. | |
| 10,923,607 | B2 | 2/2021 | Mizuta et al. | |
| 2017/0040374 | A1* | 2/2017 | Oh | H10F 39/018 |
| 2018/0190690 | A1* | 7/2018 | Lee | H10F 39/024 |
| 2020/0350354 | A1 | 11/2020 | Park et al. | |
| 2021/0375973 | A1* | 12/2021 | Ha | H10F 39/153 |
| 2022/0013562 | A1 | 1/2022 | Yang et al. | |
| 2022/0020804 | A1* | 1/2022 | Kim | H10F 39/014 |
| 2022/0028915 | A1 | 1/2022 | Jang et al. | |
| 2022/0037385 | A1* | 2/2022 | Bang | H10F 39/805 |
| 2022/0109014 | A1* | 4/2022 | Song | H10F 39/8023 |

FOREIGN PATENT DOCUMENTS

KR 102435057 B1 8/2022

* cited by examiner

*Primary Examiner* — Syed I Gheyas
(74) *Attorney, Agent, or Firm* — Wolf, Greenfield & Sacks, P.C.

(57) ABSTRACT

An image sensor includes a substrate that includes a first surface and a second surface that faces the first surface, where the substrate includes a pixel array region, a light-blocking region that at least partially surrounds the pixel array region, and a pad region that at least partially surrounds the light-blocking region, a back surface trench that is in the pad region and extends from the second surface toward the first surface of the substrate, a back surface conductive pad in the back surface trench, and a first back surface via that is in the back surface trench and in a first hole that is spaced apart from the back surface conductive pad in a horizontal direction, where the first back surface via includes a first conductive pattern on an inner surface of the first hole and a second conductive pattern on the first conductive pattern.

20 Claims, 20 Drawing Sheets

IMAGE SENSOR AND MANUFACTURING METHOD OF THE SAME

CROSS-REFERENCE TO RELATED APPLICATION

This application is based on and claims priority under 35 U.S.C. § 119 to Korean Patent Application No. 10-2023-0107100, filed on Aug. 16, 2023 in the Korean Intellectual Property office, the disclosure of which is incorporated by reference herein in its entirety.

TECHNICAL FIELD

The present disclosure relates to an image sensor and a manufacturing method of the image sensor.

BACKGROUND

Image sensors are semiconductor-based sensors, which receive light and generate electrical signals, and may include pixel arrays including a plurality of pixels, circuits for driving the pixel arrays and generating images, etc. The plurality of pixels may include photodiodes (PD), which generate charges in response to external light, pixel circuits, which convert the charges generated by the PDs into electrical signals, etc. The image sensors may be widely applied to smartphones, tablet personal computers (PCs), laptop computers, televisions, cars, or the like in addition to cameras for taking pictures or videos. Recently, research has been conducted to reduce the step difference between the pixel array region and the pad area of the image sensors.

SUMMARY

The present disclosure provides an image sensor having improved image quality and yield.

The technical issues of the present disclosure are not limited to the above-mentioned issues, and other technical issues not mentioned above may be clearly understood by one of ordinary skill in the art from the following descriptions.

According to an aspect of the present disclosure, there is provided an image sensor including a substrate that includes a first surface and a second surface that faces the first surface, where the substrate includes a pixel array region, a light-blocking region that at least partially surrounds the pixel array region, and a pad region that at least partially surrounds the light-blocking region, a back surface trench that is in the pad region and extends from the second surface toward the first surface of the substrate, a back surface conductive pad in the back surface trench, and a first back surface via that is in the back surface trench and in a first hole that is spaced apart from the back surface conductive pad in a horizontal direction, where the first back surface via includes a first conductive pattern on an inner surface of the first hole and a second conductive pattern on the first conductive pattern.

According to another aspect of the present disclosure, there is provided an image sensor including a first transistor, a first wiring that is electrically connected to the first transistor, a second substrate including a second transistor, where the second substrate includes a first surface that is adjacent to the first substrate and a second surface that faces the first surface, a second wiring that is electrically connected to the second transistor, a back surface via in a first hole that extends into the second substrate, where the back surface via is electrically connected to the first wiring, and a back surface via stack in a second hole that extends into the second substrate, where the back surface via stack is electrically connected to the first wiring and the second wiring, where the back surface via includes a first conductive pattern on an inner sidewall of the first hole, where the back surface via stack includes a second conductive pattern on an inner sidewall of the second hole, where the first conductive pattern and the second conductive pattern include an identical material, and where a vertical height of an upper surface of the first conductive pattern from the first surface of the second substrate is lower less than a vertical height of an upper surface of the second conductive pattern from the first surface of the second substrate.

According to another aspect of the present disclosure, there is provided an image sensor including a substrate including a front surface and a back surface that faces the front surface, where the substrate includes a pixel array region, a light-blocking region that at least partially surrounds the pixel array region, and a pad region that at least partially surrounds the light-blocking region, photoelectric converters in the pixel array region, a color filter in each of the photoelectric converters, a microlens on the color filter, a filter residual layer that is on the front surface of the substrate and in the light-blocking region, where the filter residual layer and the color filter include an identical material, a lens residual layer that is on the filter residual layer, where the lens residual layer and the microlens include an identical material, a back surface trench that is in the pad region and extends from the front surface toward the back surface of the substrate, a back surface conductive pad in the back surface trench, and a back surface via in the back surface trench and in a hole that is spaced apart from the back surface conductive pad in a horizontal direction.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
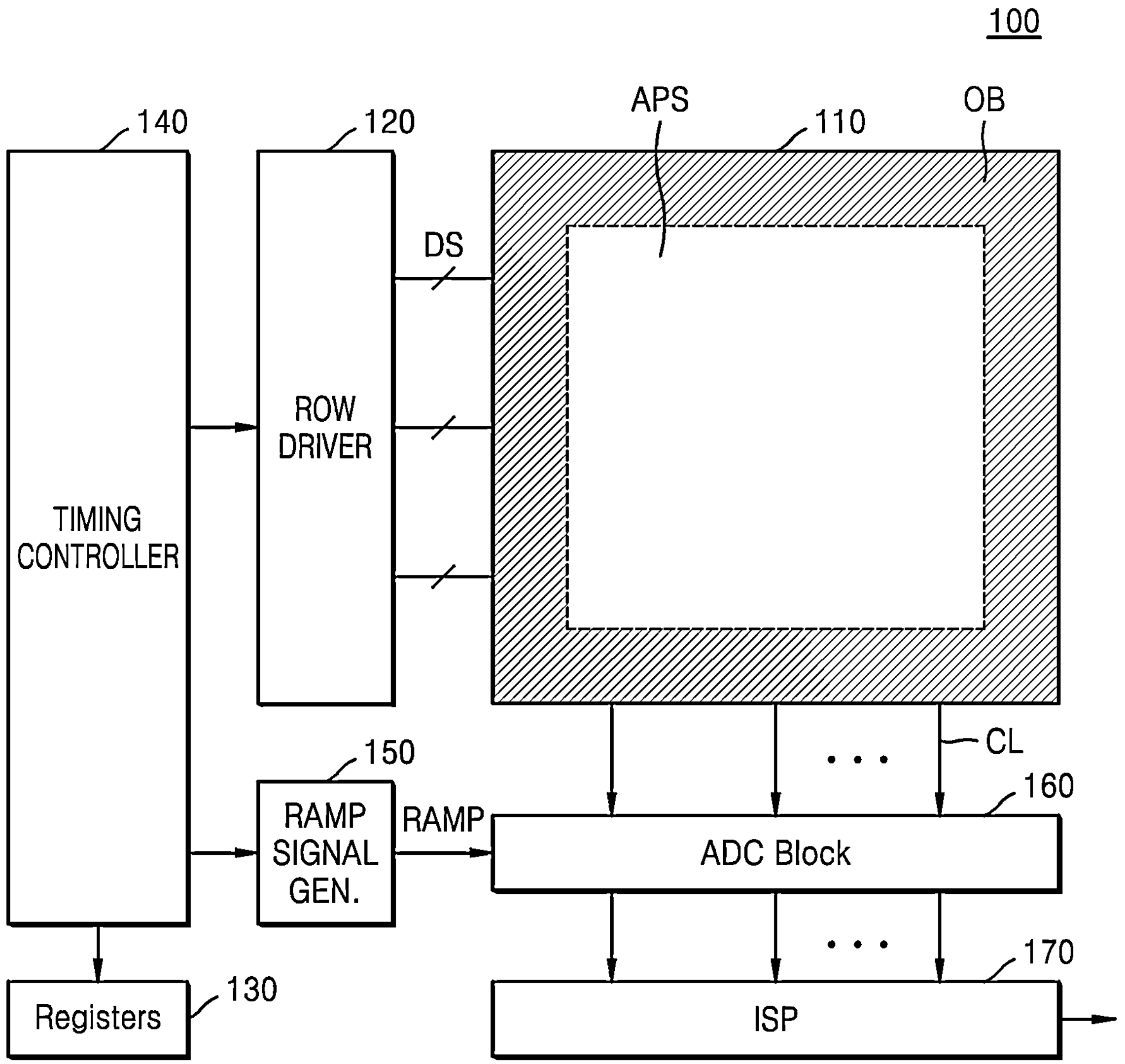
FIG. 1 is a cross-sectional view of an image sensor according to an embodiment.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. The term "connected" may be used herein to refer to a physical and/or electrical connection and may refer to a direct or indirect physical and/or electrical connection. Components or layers described with reference to "overlap" in a particular direction may be at least partially obstructed by one another when viewed along a line extending in the particular direction or in a plane perpendicular to the particular direction. It should be understood that the term "sidewall" may be interchangeably referred to as a "side surface" throughout the present disclosure.

Hereinafter, embodiments of the present disclosure are described in detail with reference to the accompanying drawings.

FIG. 1 is a cross-sectional view of an image sensor 100 according to an embodiment.

Referring to FIG. 1, the image sensor 100 may include a pixel array 110, a row driver 120, a mode setting register 130, a timing controller 140, a ramp signal generator 150, an analog to digital converter (ADC) block 160, and an image signal processor (ISP) 170.

The pixel array 110 may include a pixel array region APS and a light-blocking region OB. Each of the pixel array region APS and the light-blocking region OB may include a plurality of unit pixels arranged in two dimensions, and each unit pixel may convert an optical signal into an electrical signal. The plurality of unit pixels included in the pixel array 110 may output the electrical signal via the corresponding column line CL in response to a plurality of driving signals DS, such as pixel selection signals, reset signals, and charge transfer signals from the row driver 120 in units of rows.

The row driver 120 may select and drive the pixel array 110 in units of rows. The row driver 120 may decode a row control signal (for example, an address signal) received from the timing controller 140, generate the plurality of driving signals DS corresponding to the decoded row line, and transmit the generated plurality of driving signals DS to the pixel array 110.

The mode setting register 130 may include a register in which an application processor (AP) connected to the image sensor 100 sets an operation mode of the image sensor 100 via an interface. The AP may change an operating condition of the image sensor 100 in units of frames via the mode setting register 130.

The timing controller 140 may partially or entirely control the operation of each of the row driver 120, and the ramp signal generator 150 of the image sensor 100 according to mode setting information set in the mode setting register 130.

The ramp signal generator 150 may generate a ramp signal RAMP, which increases or decreases at a certain slope, and provide the ramp signal RAMP to the ADC block 160.

The ADC block 160 may convert an analog electrical signal output by the column lines CL of the pixel array 110 into a digital image signal by using a correlated double sample method. The correlated double sample method may perform double sampling on a noise level and a signal level of a unit pixel transferred to the column line CL, and convert a difference level corresponding to the difference between the noise level and the signal level into a digital image signal.

The ISP 170 may process the received image signal to output a final image signal. The ISP 170 may perform signal processing, such as a noise reduction process, a gain adjustment process, a waveform shaping process, an interpolation process, a white balance process, a gamma process, an edge emphasis process, and a binning process.

Figure 2:
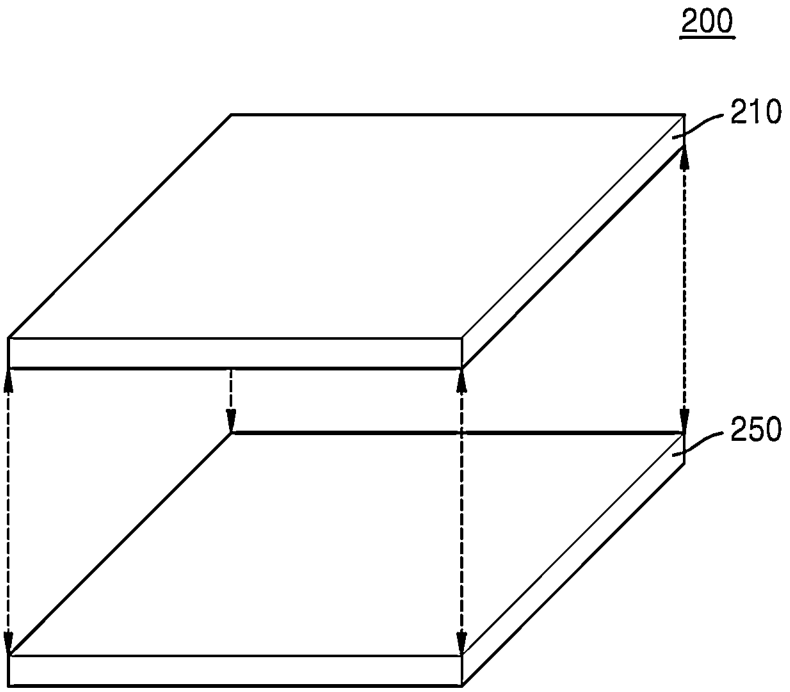
FIG. 2 is a stacking configuration diagram of an image sensor according to an embodiment.

FIG. 2 is a stacking configuration diagram of an image sensor 200 according to an embodiment.

Referring to FIG. 2, the image sensor 200 may include two semiconductor substrates, or first and second semiconductor substrates 210 and 250. The pixel array 110 of the image sensor 100 of FIG. 1 may be formed on the first semiconductor substrate 210. All circuit blocks (120 through 170) except for the pixel array 110 of the image sensor 100 of FIG. 1 may be formed on the second semiconductor substrate 250. The first semiconductor substrate 210 and the second semiconductor substrate 250 may be stacked above and below each other, and transmit signals to each other via a through silicon via (TSV) or a conductive connection member penetrating or extending through the first semiconductor substrate 210. In another embodiment, the image sensor 200 may include three semiconductor substrates stacked on each other. A photodiode and a transmission transistor of unit pixels constituting the pixel array 110 may be formed on a first semiconductor substrate. Other transistors constituting the unit pixel except for the transfer transistor may be formed on a second semiconductor substrate under the first semiconductor substrate. Transmission transistors formed on the first semiconductor substrate and corresponding transistors formed on the second semiconductor substrate may be connected to each other via the TSV, etc. A third semiconductor substrate under the second semiconductor substrate may include circuit blocks except for the pixel array 110, and may be connected to the second semiconductor substrate via the TSV, etc.

Figure 3:
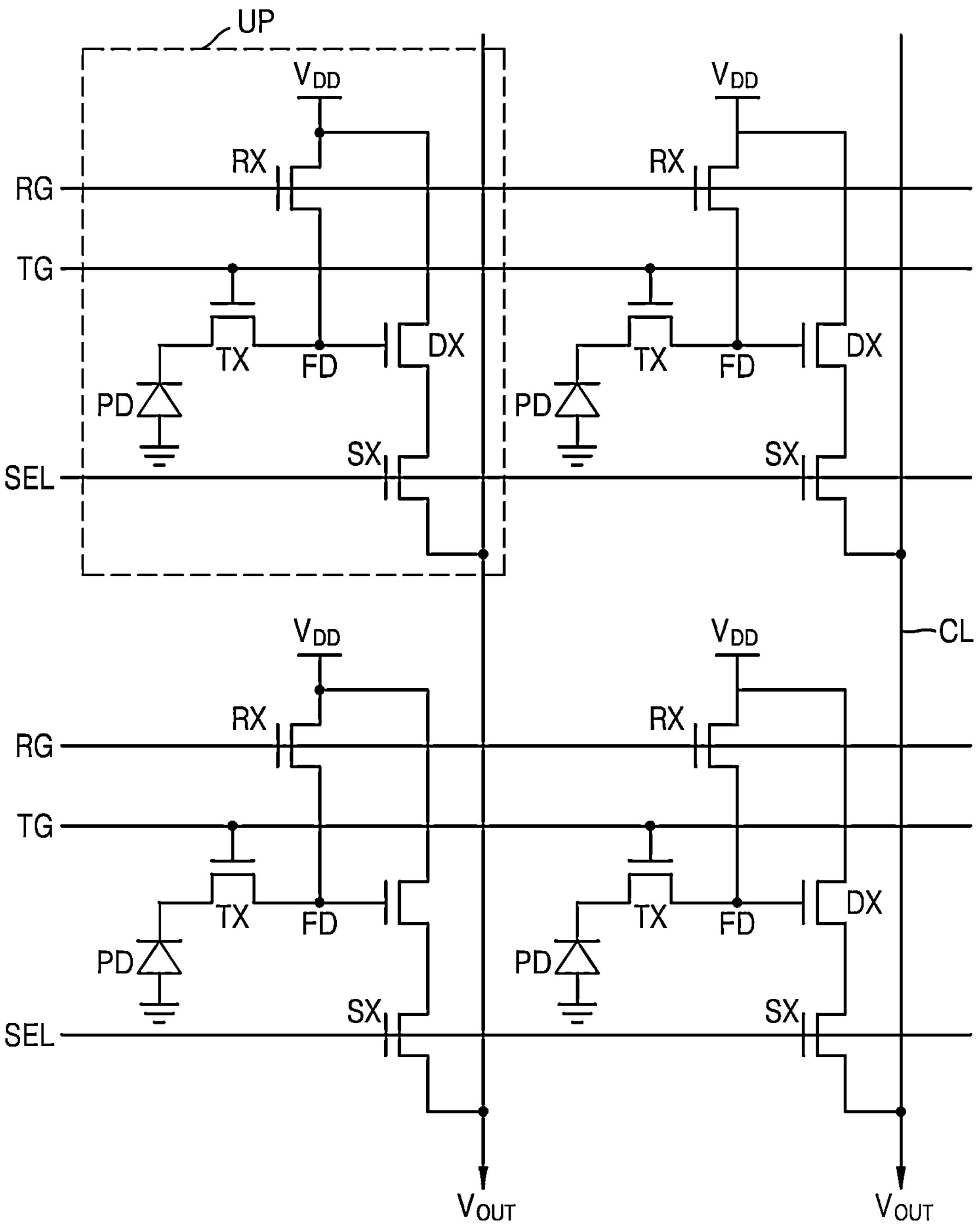
FIG. 3 is a circuit diagram of pixels constituting a portion of a pixel array of an image sensor according to an embodiment.

FIG. 3 is a circuit diagram of pixels constituting a portion of the pixel array 110 of an image sensor according to an embodiment.

Referring to FIGS. 1 and 3, the pixel array 110 may include a plurality of unit pixels UP, and the plurality of unit pixels UP may be arranged in two dimensions in a matrix form. The unit pixel UP may include a photoelectric converter PD and a plurality of transistors. The plurality of transistors may include a transmission transistor TX, a reset transistor RX, and a read circuit. The read circuit may include a source follower transistor DX and a selection transistor SX. Each unit pixel UP may further include a floating diffusion area FD commonly connected to the transmission transistor TX, the reset transistor RX, and the source follower transistor DX.

The photoelectric converter PD may generate and accumulate charges in proportion to the amount of light incident from the outside during an exposure time. The photoelectric converter PD may include any one of a photodiode, a phototransistor, a photogate, and a pinned photodiode.

The transmission transistor TX may transmit charges accumulated in the photoelectric converter PD during the exposure time to the floating diffusion area FD in response to a transmission control signal. The floating diffusion area FD may receive the accumulated charges from the photoelectric converter PD, store the received accumulated charges, and generate a voltage according to the amount of the transmitted charges.

The reset transistor RX may reset charges transmitted to the floating diffusion area FD. A source of the reset transistor RX may be connected to the floating diffusion area FD, and a drain of the reset transistor RX may be connected to a power voltage VDD. When the reset transistor RX is turned on by a reset control signal RG, the power voltage VDD of the drain of the reset transistor RX may be applied to the floating diffusion area FD, and release the stored charges. Accordingly, when the reset transistor RX is turned on, all charges transmitted to the floating diffusion area FD may be discharged, and a voltage of the floating diffusion area FD may be reset to the power voltage VDD.

The source follower transistor DX may include a gate connected to the floating diffusion area FD and a drain connected to the power voltage VDD, and may perform as a source follower buffer amplifier generating an output voltage to the source of the source follower transistor DX in response to a gate voltage. The selection transistor SX may transmit a source voltage, which is an output of the source follower transistor DX, to the column line CL in response to a column selection signal SEL. That is, the read circuit may sense a voltage change in the floating diffusion area FD, and accordingly, output the sensed voltage change as an output voltage Vout to the column line CL.

In the unit pixel UP in FIG. 3, the photoelectric converter PD and the read circuit may correspond to each other 1:1, but the unit pixel UP constituting a high-resolution image sensor may share the read circuit in a structure in which the plurality of photoelectric converters PD are commonly connected to one floating diffusion area FD. In addition, in the unit pixel UP in FIG. 3, the reset transistor RX and the floating diffusion area FD are directly connected to each other, but in the other unit pixel UP for securing a high dynamic range DR, a conversion gain transistor, which converts the conversion gain between the reset transistor RX and the floating diffusion area FD, may be further included.

Figure 4:
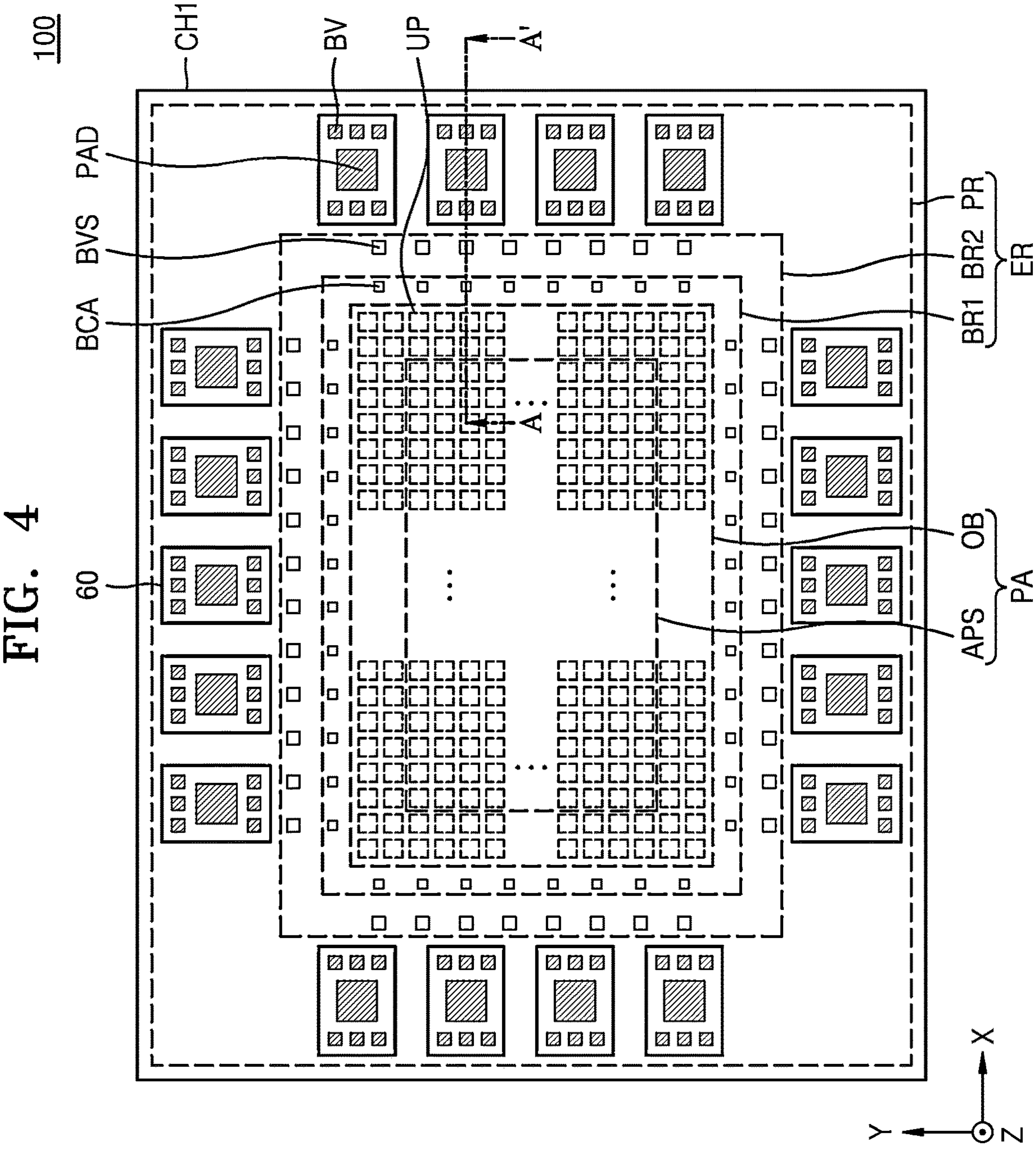
FIG. 4 is a plan view of an image sensor according to an embodiment.
Figure 5:
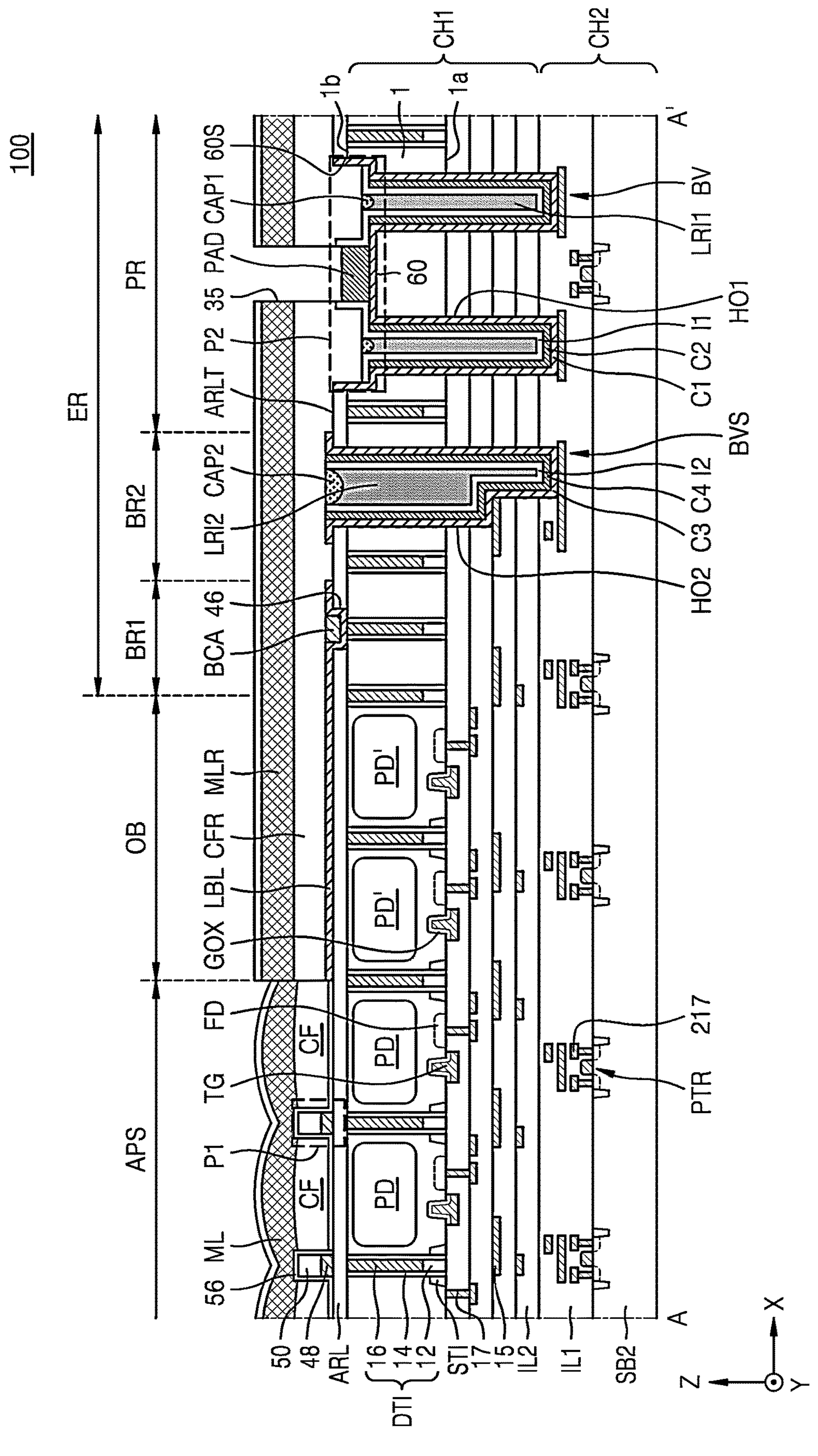
FIG. 5 is a cross-sectional view taken along line A-A' in FIG. 4.
Figure 6A:
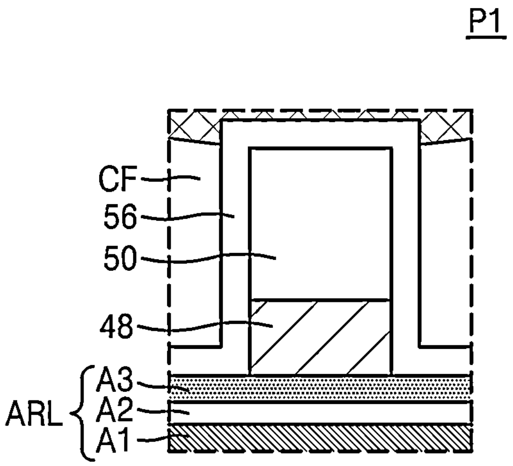
FIG. 6A is an enlarged diagram of portion P1 in FIG. 5.
Figure 6B:
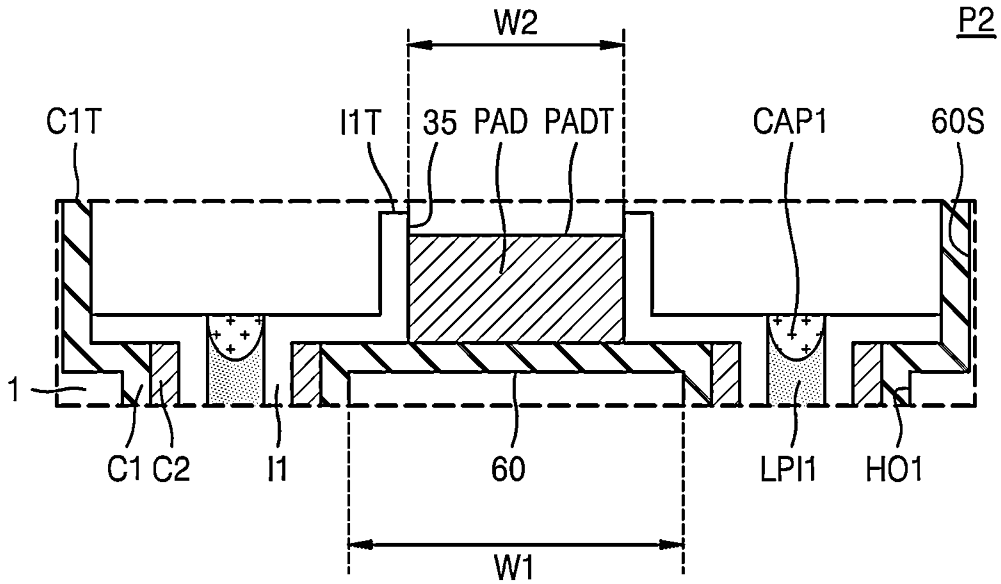
FIG. 6B is an enlarged diagram of portion P2 in FIG. 5.

FIG. 4 is a plan view of the image sensor 100 according to an embodiment. FIG. 5 is a cross-sectional view taken along line A-A' in FIG. 4. FIG. 6A is an enlarged diagram of portion P1 in FIG. 5. FIG. 6B is an enlarged diagram of portion P2 in FIG. 5. Descriptions are given with reference to FIG. 1 together.

Referring to FIGS. 4 and 5, the image sensor 100 may have a structure in which first and second sub chips CH1 and CH2 are bonded in a stack shape. The first sub chip CH1 may be arranged on the second sub chip CH2. The first sub chip CH1 may include a first substrate 1. The first substrate 1 may include, for example, a silicon single crystal wafer, a silicon epitaxial layer, or a silicon on insulator (SOI) substrate. The first substrate 1 may be doped with, for example, impurities of a first conductivity type. The first conductivity type may be a P-type conductivity. The first substrate 1 may include a front surface 1*a* and a rear surface 1*b* facing each other. In the present disclosure, the front surface 1*a* may be referred to as a first surface, and the rear surface 1*b* may be referred to as a second surface.

In the present disclosure, a first horizontal direction X may be defined as a direction that is parallel with the rear surface 1*b* of the first substrate 1, a second horizontal direction Y may be defined as a direction crossing or intersecting the first horizontal direction X and parallel with the rear surface 1*b* of the first substrate 1, and a vertical direction Z may be defined as a direction perpendicular to the rear surface 1*b* of the first substrate 1.

The image sensor 100 may include a pixel array region APS, a light-blocking region OB, and an edge region ER in a plan view. Each of the plurality of unit pixels UP may be included in the first substrate 1 of the pixel array region APS and the light-blocking region OB. The light-blocking region OB may at least partially surround the pixel array region APS. The edge region ER may at least partially surround the light-blocking region OB. The edge region ER may include a contact region BR1, a back surface via stack region BR2, and a pad region PR. The back surface via stack region BR2 may be between the contact region BR1 and the pad region PR. The pad region PR may be located at the outermost edge of the edge region ER. Back surface contacts BCA may be arranged in the contact region BR1 of a back surface 1*b* of the first substrate 1 of the edge region ER, a back surface via stack BVS may be arranged in the back surface via stack region BR2, and back surface vias BV and back surface conductive pads PAD may be arranged in the pad region PR.

A pixel separator DTI may be arranged in the first substrate 1 in the pixel array region APS and the light-blocking region OB, and regions of the unit pixels UP may be separated/limited. The pixel separator DTI may also be formed in the edge region ER. The pixel separator DTI may have a mesh shape in a plan view. The pixel separator DTI may be inside a trench that extends from a front surface 1*a* toward the back surface 1*b* of the first substrate 1. The extension direction of the pixel separator DTI may also include a direction from the back surface 1*b* toward the front surface 1*a* according to the process sequence of the image sensor 100. Each pixel separator DTI may include a buried insulating pattern 12, a separation insulating pattern 14, and a separation conductive pattern 16. The buried insulating pattern 12 may be arranged between the separation conductive pattern 16 and the first interlayer insulating layer IL1. The separation insulating pattern 14 may be arranged between the separation conductive pattern 16 and the first substrate 1, and between the buried insulating pattern 12 and the first substrate 1.

The buried insulating pattern 12 and the separation insulating pattern 14 may include an insulating material having different refractive indexes from that of the first substrate 1. The buried insulating pattern 12 and the separation insulating pattern 14 may include, for example, silicon oxide. The separation conductive pattern 16 may be apart from the first substrate 1. The separation conductive pattern 16 may include a polysilicon layer or a silicon germanium layer doped with impurities. The impurity doped onto the polysilicon layer or the silicon germanium layer may include, for example, one of boron, phosphorus, and arsenic. Alternatively, the separation conductive pattern 16 may include a metal layer.

The photoelectric converters PD may be doped with impurities of the second conductivity type that is opposite to the first conductivity type. The second conductivity type may include, for example, N-type. The N-type impurities doped onto the photoelectric converter PD may constitute a photodiode by forming a P-N junction with the P-type impurities doped onto the first substrate 1 on the surrounding the impurities.

Device isolators STI adjacent to the front surface 1*a* may be arranged in the first substrate 1. The device isolators STI may be penetrated by the pixel separator DTI. The device isolators STI may isolate active regions in which transistors of each unit pixel UP are formed. In other words, the active regions may be provided for transistors (TX, RX, DX, and SX) of the unit pixel UP.

In each unit pixel UP, a gate TG of the transmission transistor TX may be arranged on the front surface 1*a* of the first substrate 1. A portion of the gate TG may have a vertical shape extending into the first substrate 1. Alternatively, the gate TG may also have a planar type that does not extend into the first substrate 1 and has a flat shape. A gate insulating layer GOX may be between the gate TG and the first substrate 1. The floating diffusion area FD may be arranged in the first substrate 1 on one side of the gate TG. The floating diffusion area FD may be doped with, for example, the impurity of a second conductivity.

The image sensor 100 may include a back surface reception image sensor. Light may be incident on the photodiode, which is the photoelectric converter PD formed in the pixel array region APS of the first substrate 1, via the back surface 1*b* of the first substrate 1. Electron-hole pairs may be generated by light incident on the photodiode, and electrons may accumulate in the photodiode. When a turn-on voltage is applied to the gate TG of the transmission transistor TX, the accumulated electrons may be moved to the floating diffusion region FD.

The first sub chip CH1 may further include the first interlayer insulating layer IL1 arranged on the front surface 1*a*. The first interlayer insulating layer IL1 may include a multilayer including at least one of a silicon oxide layer, a silicon nitride layer, a silicon oxynitride layer, and a porous low dielectric layer. First wirings 15 may be arranged between each of the first interlayer insulating layers IL1. The floating diffusion region FD may be connected to the first wirings 15 via contact plugs 17. The contact plug 17 may penetrate or extend into the first interlayer insulating layer IL1 closest to the front surface 1*a*, or the lowermost first interlayer insulating layer IL1, among the first interlayer insulating layers IL1 in the pixel array region APS.

The second sub chip CH2 may include a second substrate SB2, transistors PTR arranged on the second substrate SB2, and a second interlayer insulating layer IL2 covering or overlapping the second substrate SB2. Second wirings 217 may be arranged in the second interlayer insulating layer IL2. The second sub chip CH2 may include circuit blocks (120 through 170) which convert electrical signals of a pixel into image signals via the column lines CL of the pixel array 110 of the first sub chip CH1.

Referring to FIGS. 5 and 6A, an anti-reflection structure ARL may be arranged on the back surface 1*b* of the first substrate 1. The anti-reflection structure ARL may be arranged in the pixel array region APS, the light-blocking region OB, and the edge region ER. The anti-reflection structure ARL may not be arranged in the back surface contact BCA, the back surface via stack BVS, and the back surface vias BV.

The anti-reflection structure ARL may include a first insulating layer A1, a second insulating layer A2, and a third insulating layer A3, which are sequentially stacked. In one embodiment, the first insulating layer A1 may include aluminum oxide, the second insulating layer A2 may include silicon oxide, and the third insulating layer A3 may include hafnium oxide. In addition, the third insulating layer A3 may also be replaced by a titanium oxide layer, which is conductive. The anti-reflection structure ARL may suppress the reflection of light incident according to the thickness and refractive index of each layer, and increase the amount of light incident on the photodiode.

A light-blocking grid pattern 48 may be arranged on the anti-reflection structure ARL of the pixel array region APS. A low refractive grid pattern 50 may be arranged on the light-blocking grid pattern 48. The light-blocking grid pattern 48 and the low refractive grid pattern 50 may have a mesh shape in a plan view and may vertically overlap the pixel separator DTI. Overlapping vertically may mean overlapping in the vertical direction Z. The light-blocking grid pattern 48 may include, for example, at least one of titanium and titanium nitride. The low refractive grid pattern 50 may have a thickness that is the same as or greater than a thickness of the pixel separator DTI, and may include an organic material having a low refractive index.

A protection layer 56 for conformally preventing moisture absorption may be arranged on the low refractive grid pattern 50 and the anti-reflection structure ARL of the pixel array region APS. Color filters CF may be arranged between the low refractive grid patterns 50 and on the protection layers 56. Each of the color filters CF may have one of a blue color, green color, and red color. Alternatively, the color filters CF may also include other colors, such as cyan, magenta, and yellow. In the image sensor 100 according to an embodiment, the color filters CF may be arranged in a bayer pattern shape. In another embodiment, the color filters CF may be arranged in a 2×2 arrangement tetra pattern shape, a 3×3 arrangement nona pattern shape, or a 4×4 arrangement hexadeca pattern shape. The low refractive grid pattern 50 may have a lower refractive index than the color filters CF. For example, the low refractive grid pattern 50 may have a refractive index that is equal to or less than about 1.3. The light-blocking grid pattern 48 and the low refractive grid pattern 50 may prevent crosstalk between adjacent unit pixels UP.

Referring to FIGS. 4 and 5, a light-blocking structure LBL may be arranged on the anti-reflection structure ARL in the light-blocking region OB of the first substrate 1. The light-blocking structure LBL may extend to the contact region BR1. The light-blocking structure LBL may block light from entering a photodiode PD' formed on the first substrate 1 of the light-blocking region OB. The photodiode PD' formed in the light-blocking region OB may have the same structure as the photodiode PD formed in the pixel array region APS, which is the photoelectric converter PD, but may not perform the same operation (that is, an operation of receiving light and generating an electrical signal) as the photoelectric converter PD. In other words, because light is blocked inform reaching the photodiode PD' formed in the light-blocking region OB, a dark level reference signal value may be generated. The image signal processor 170 in FIG. 1 may compensate for the dark level of the output values of the pixels in the pixel array region APS by using the dark level reference signal value.

The light-blocking structure LBL may cover or overlap side surfaces and a bottom surface of a first back surface trench 46 in the contact region BR1. The light-blocking structure LBL may cover or overlap side surfaces and a bottom surface of the back surface contact BCA. The light-blocking structure LBL may have a multi-layer structure. The light-blocking structure LBL may include a barrier metal layer and a metal layer. The barrier metal layer may include a material, such as titanium and titanium nitride, and the metal layer may include a metal material, such as tungsten.

The back surface contact BCA may be arranged in the first back surface trench 46. The first back surface trench 46 may include a portion penetrating or extending into the anti-reflection structure ARL, and partially penetrating or extending into the back surface 1*b* of the first substrate 1. The first back surface trench 46 may expose any one of the pixel separators DTI. The back surface contacts BCA may be connected to any one of the pixel separators DTI via the light-blocking structure LBL. The back surface contacts BCA may apply, for example, a ground voltage or a negative potential to the pixel separator DTI. The back surface contacts BCA may include titanium, aluminum, and/or titanium nitride.

In the pad region PR, a second back surface trench 60 may penetrate or extend into the anti-reflection structure ARL, and may partially penetrate or extend into the back surface 1*b* of the first substrate 1. The second back surface trench 60 may include a portion recessed from the back surface 1*b* toward the front surface 1*a* of the first substrate 1. In the pad region PR, first holes HO1 may vertically overlap the second back surface trench 60. In a plan view, the first holes HO1 may be arranged in the second back surface trench 60.

The back surface vias BV may be respectively arranged in the first holes HO1. Each of the back surface vias BV may penetrate or extend into the first substrate 1 and the first interlayer insulating layers IL1, and may partially penetrate or extend into the second interlayer insulating layer IL2. The back surface vias BV may be respectively connected to second wirings 217. The back surface vias BV may include a first conductive pattern C1, a second conductive pattern C2, a first insulating layer I1, a first low refraction protection pattern LRI1, and a first capping pattern CAP1. The first conductive pattern C1, the second conductive pattern C2, and the first insulating layer I1 may be sequentially arranged from an inner sidewall of a first hole HO1. The first conductive pattern C1 may cover or overlap the inner sidewall of a bottom surface of the first hole HO1. The second conductive pattern C2 may cover or overlap a surface of the first conductive pattern C1 in the first hole HO1. The first insulating layer I1 may cover or overlap a surface of the second conductive pattern C2 in the first hole HO1. The first low refraction protection pattern LRI1 may fill or be in a space surrounded by the first insulating layer I1 in the first hole HO1. The first capping pattern CAP1 may be arranged on the first low refraction protection pattern LRI1. The first conductive pattern C1 may extend to a bottom surface and a sidewall 60S of the second back surface trench 60. The first insulating layer I1 may extend onto a sidewall of a back surface conductive pad PAD. The first insulating layer I1 may include an insulating layer, such as silicon oxide.

The first conductive pattern C1 may be connected to some of second wirings 217 and the back surface conductive pad PAD. Accordingly, each of the back surface vias BV may be connected to some of the second wirings 217 and the back surface conductive pad PAD. Each of the back surface vias BV may perform as an electrical path between the second wirings 217 and the back surface conductive pad PAD. In other words, signals input from the outside of the image sensor 100 or output by the image sensor 100 may be interfaced by the back surface vias BV and the back surface conductive pads PAD.

The first conductive pattern C1 may have a multi-layer structure. The first conductive pattern C1 may include a barrier metal layer and a metal layer. The barrier metal layer may include a material, such as titanium and titanium nitride. The metal layer may include a metal material, such as tungsten. The second conductive pattern C2 may include titanium, aluminum, and/or titanium nitride. The second conductive pattern C2 may include the same material as the back surface contact BCA.

The back surface conductive pad PAD may be arranged in the second back surface trench 60. The back surface conductive pad PAD may be spaced apart from the first hole HO1. The back surface conductive pad PAD may contact the first conductive pattern C1 extending to a bottom surface of the second back surface trench 60. The back surface conductive pad PAD may be apart from the first substrate 1 with the first conductive pattern C1 therebetween. The back surface conductive pad PAD may be connected to the second wirings 217 via the first conductive pattern C1. The back surface conductive pad PAD may include the same material as the back surface contact BCA and the second conductive pattern C2. The back surface conductive pad PAD may include titanium, aluminum, and/or titanium nitride.

Referring to FIGS. 5 and 6B, a vertical level of an upper surface CIT of the first conductive pattern C1 may be lower or equal to a vertical level of an upper surface ARLT of the anti-reflection structure ARL. A vertical level may mean a height from the front surface 1*a* of the first substrate 1 in the vertical direction Z. As an example, a vertical level of the upper surface CIT of the first conductive pattern C1 may be higher than a vertical level of an upper surface PADT of the back surface conductive pad PAD. A vertical level of an upper surface I1T of the first insulating layer I1 may be higher than a vertical level of the upper surface PADT of the back surface conductive pad PAD.

Vertical levels of the upper surface of the first low refraction protection pattern LRI1 and the upper surface of the first capping pattern CAP1 may be lower than the vertical level of the upper surface PADT of the back surface conductive pad PAD. Vertical levels of the upper surface of the first low refraction protection pattern LRI1 and the upper surface of the first capping pattern CAP1 may be lower than the vertical level of the upper surface ARLT of the anti-reflection structure ARL.

The first conductive pattern C1 and the first insulating layer I1 may not extend to the upper surface ARLT of the anti-reflection structure ARL. The second conductive pattern C2 may not extend to a bottom surface of the second back surface trench 60.

Referring to FIG. 6B, a minimum distance between two adjacent first holes HO1 may be a first width W1. The first width W1 may be a distance between the first holes HO1 in the first horizontal direction X. The back surface conductive pad PAD may have a second width W2. The second width W2 may be a width of the back surface conductive pad PAD in the first horizontal direction X or the second horizontal direction Y. The first width W1 may be greater than the second width W2.

Referring to FIGS. 4 and 5 again, in the back surface via stack region BR2, the back surface via stack BVS may be arranged in a second hole HO2. The back surface via stack BVS may penetrate or extend into the anti-reflection structure ARL, the first substrate 1, and the first interlayer insulating layers IL1, and partially penetrate or extend into the second interlayer insulating layer IL2. The back surface via stack BVS may include a third conductive pattern C3, a fourth conductive pattern C4, a second insulating layer 12, a second low refraction protection pattern LRI2, and a second capping pattern CAP2. The third conductive pattern C3, the fourth conductive pattern C4, and the second insulating layer 12 may be sequentially arranged from the inner sidewall of the second hole HO2. The fourth conductive pattern C4 may cover or overlap a surface of the third conductive pattern C3 in the second hole HO2. The second insulating layer 12 may cover or overlap a surface of the fourth conductive pattern C4 in the second hole HO2. The third conductive pattern C3 may be apart from the first conductive pattern C1 and the light-blocking structure LBL. The second insulating layer 12 may include the same material as the first insulating layer I1. The second insulating layer 12 may include an insulating material, such as silicon oxide.

The third conductive pattern C3 may connect some of the first wirings 15 to the second wirings 217. Accordingly, the back surface via stack BVS may connect any one of the first wirings 15 to any one of the second wirings 217. The back surface via stack BVS may function as an electrical path between the first wirings 15 and the second wirings 217.

A vertical level of the uppermost surface of the third conductive pattern C3 may be higher than the vertical level of the upper surface ARLT of the anti-reflection structure ARL. The vertical level of the uppermost surface of the third conductive pattern C3 may be higher than the upper surface of the first conductive pattern C1 (CIT in FIG. 6B).

The third conductive pattern C3 may have a multi-layer structure. The third conductive pattern C3 may include a barrier metal layer and a metal layer. The barrier metal layer may include a material, such as titanium and titanium nitride. The metal layer may include a metal material, such as tungsten. The fourth conductive pattern C4 may include the same material as the back surface contact BCA, the first conductive pattern C1, and the back surface conductive pad PAD. The fourth conductive pattern C4 may include a material, such as titanium, aluminum, and titanium nitride.

The second low refraction protection pattern LRI2 may fill a space surrounded by the second insulating layer 12 in the second hole HO2. The second capping pattern CAP2 may be arranged on the second low refraction protection pattern LRI2.

A filter residual layer CFR may be arranged on the light-blocking structure LBL. The filter residual layer CFR may be arranged in the light-blocking region OB and the edge region ER. The filter residual layer CFR may fill or be in the remaining space of the second back surface trench 60.

A lens residual layer MLR may be arranged on the filter residual layer CFR. In the pad region PR, an opening 35 exposing the back surface conductive pad PAD may be arranged in the filter residual layer CFR, the lens residual layer MLR, and the first insulating layer I1.

In the pixel array region APS, micro lenses ML may be arranged on the color filters CF. Edges of the micro lenses ML may contact and be connected to each other. The micro lenses ML may constitute an array. The micro lenses ML may be referred to as a ‘micro lens array’.

The lens residual layer MLR and the micro lenses ML may include the same material.

When only the back surface conductive pad PAD is provided in the second back surface trench 60, the first conductive pattern C1 and the first insulating layer I1 constituting each of the back surface vias BV may extend to the upper surface ARLT of the anti-reflection structure ARL. In this case, due to a thickness of the first conductive pattern C1 and the first insulating layer I1, a step may occur between the color filter CF in the pixel array region APS and the filter residual layer CFR in the edge region ER. The step may cause an imbalance in incident light, reduce the image quality of the image sensor 100, and increase the process difficulty in pattern forming, and thus, the step may reduce the yield of the image sensor 100.

According to the technical concept of the present disclosure, in the pad region PR, the back surface conductive pad PAD and the back surface vias BV may be arranged in the second back surface trench 60 of the back surface 1*b* of the first substrate 1. Because the back surface vias BV are arranged in the second back surface trench 60, the first conductive pattern C1 and the first insulating layer I1 constituting the back surface vias BV may not extend onto the upper surface ARLT of the anti-reflection structure ARL. In this manner, a step between the color filter CF in the pixel array region APS and the filter residual layer CFR in the edge region ER may be reduced. As such, the image quality and the yield of the image sensor 100 may be improved.

Figure 6C:
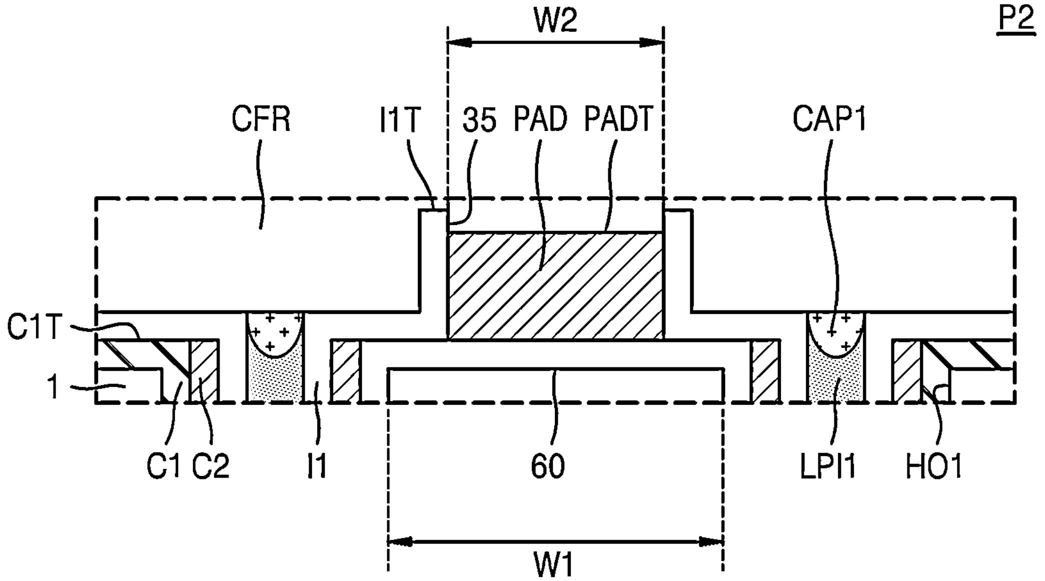
FIG. 6C is an enlarged diagram of portion P2 in FIG. 5.

FIG. 6C is an enlarged diagram of portion P2 in FIG. 5. Hereinafter, duplicate descriptions given with reference to FIGS. 4 though 6B are omitted, and only differences therebetween are described.

Referring to FIGS. 5 and 6C, the first conductive pattern C1 may cover or overlap the bottom surface of the second back surface trench 60 but may not extend to the sidewall 60S of the second back surface trench 60. The vertical level of the upper surface CIT of the first conductive pattern C1 may be lower than vertical levels of an upper surface I1T of the first insulating layer I1 and the upper surface PADT of the back surface conductive pad PAD. The first insulating layer I1 and the back surface conductive pad PAD may cover or overlap the upper surface CIT of the first conductive pattern C1.

Figure 6D:
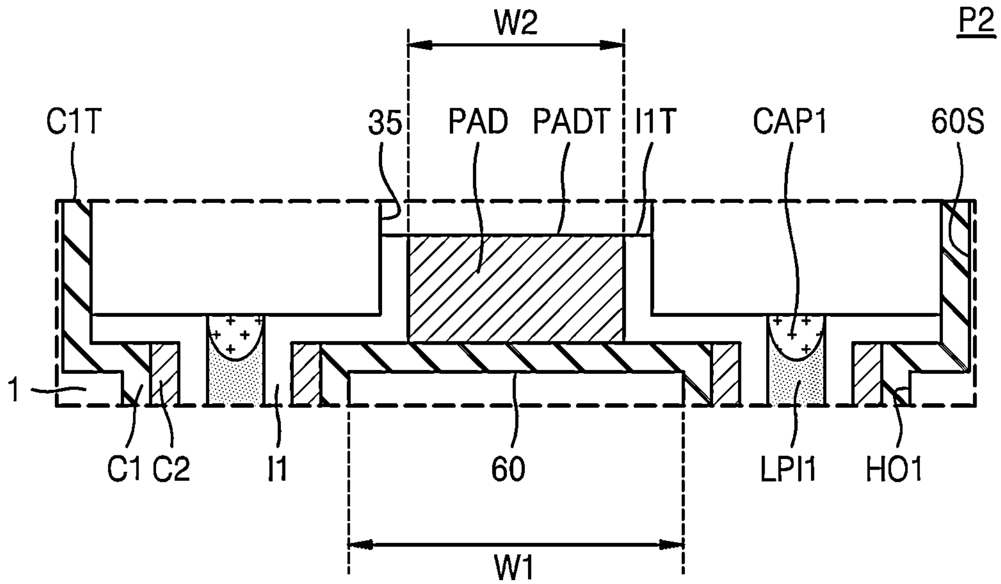
FIG. 6D is an enlarged diagram of portion P2 in FIG. 5.

FIG. 6D is an enlarged diagram of portion P2 in FIG. 5. Hereinafter, duplicate descriptions given with reference to FIGS. 4 though 6B are omitted, and only differences therebetween are described.

Referring to FIGS. 5 and 6D, the vertical level of the upper surface I1T of the first insulating layer I1 may be substantially the same as the vertical level of the upper surface PADT of the back surface conductive pad PAD. Widths of the opening 35 in the first horizontal direction X and the second horizontal direction Y may be greater than widths of the opening 35 in FIG. 6B in the first horizontal direction X and the second horizontal direction Y. In other words, in a manufacturing process of forming the opening 35, the vertical level of the upper surface I1T of the first insulating layer I1 may be lowered.

Figure 7:
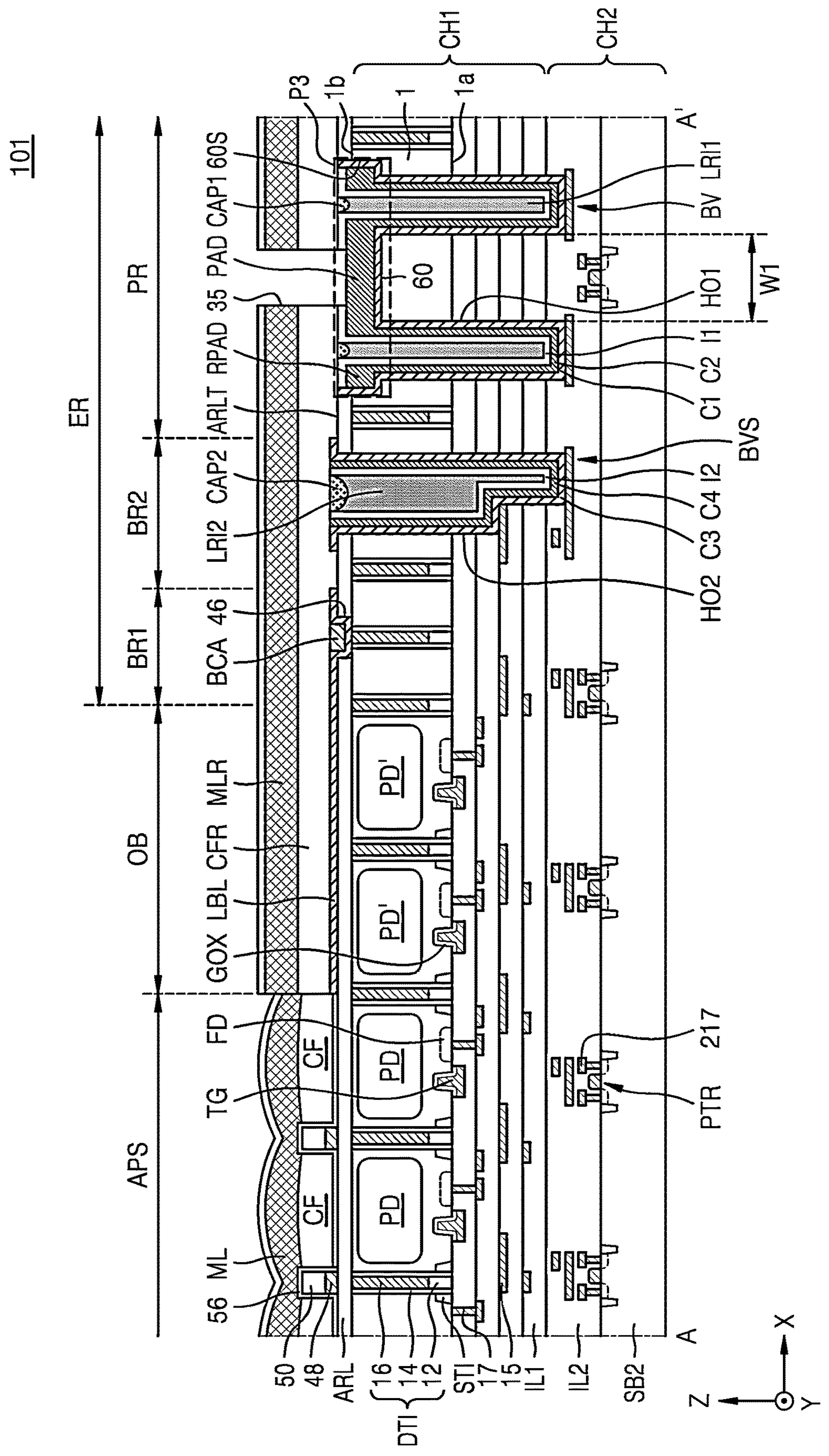
FIG. 7 is a cross-sectional view of an image sensor taken along line A-A' in FIG. 4.
Figure 8:
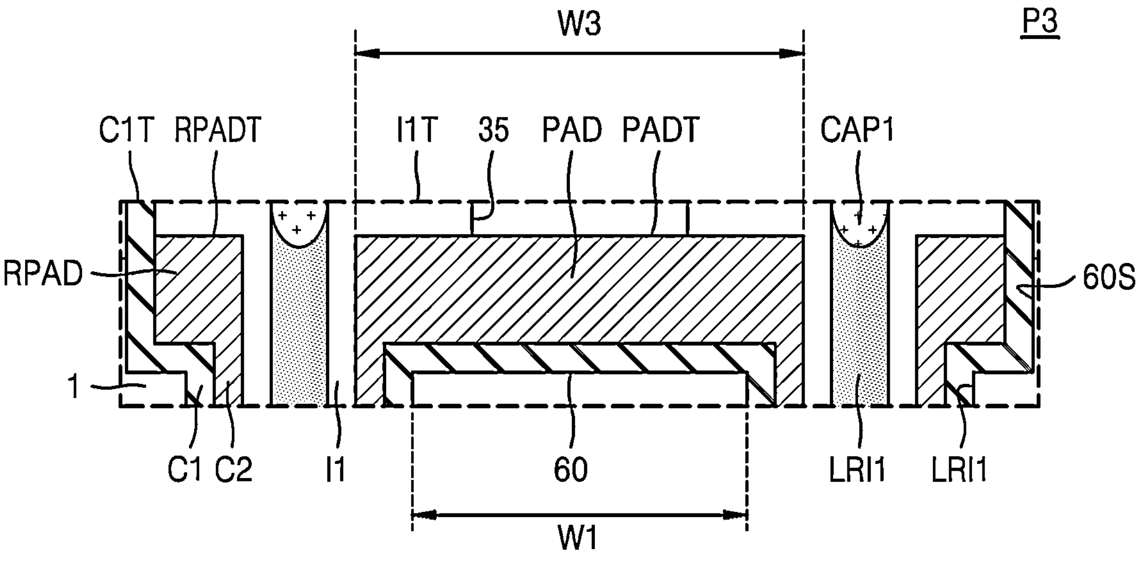
FIG. 8 is an enlarged diagram of region P3 of an image sensor in FIG. 7.

FIG. 7 is a cross-sectional view of the image sensor 100 taken along line A-A' in FIG. 4. FIG. 8 is an enlarged diagram of region P3 of an image sensor 101 in FIG. 7. Hereinafter, duplicate descriptions given with reference to FIGS. 4 though 6B are omitted, and only differences therebetween are described.

Referring to FIGS. 7 and 8, a residual conductive pad RPAD may be arranged in the second back surface trench 60. The residual conductive pad RPAD may be arranged on the same level as the back surface conductive pad PAD. The residual conductive pad RPAD may be connected to the back surface conductive pad PAD via the second conductive pattern C2.

The back surface conductive pad PAD may have a third width W3. The third width W3 may be a width of the back surface conductive pad PAD in the first horizontal direction X or the second horizontal direction Y. The third width W3 may be greater than the first width W1.

The first insulating layer I1 may extend onto the sidewalls of the back surface conductive pad PAD and sidewalls of the residual conductive pad RPAD. The first insulating layer I1 may extend to the upper surface PADT of the back surface conductive pad PAD and an upper surface RPADT of the residual conductive pad RPAD. The vertical level of the upper surface I1T of the first insulating layer I1 may be substantially the same as the vertical level of the upper surface CIT of the first conductive pattern C1. The vertical level of the upper surface I1T of the first insulating layer I1 may be substantially the same as the upper surface ARLT of the anti-reflection structure ARL.

FIGS. 9 through 16 are cross-sectional views sequentially illustrating a manufacturing method of an image sensor, according to embodiments.

Figure 9:
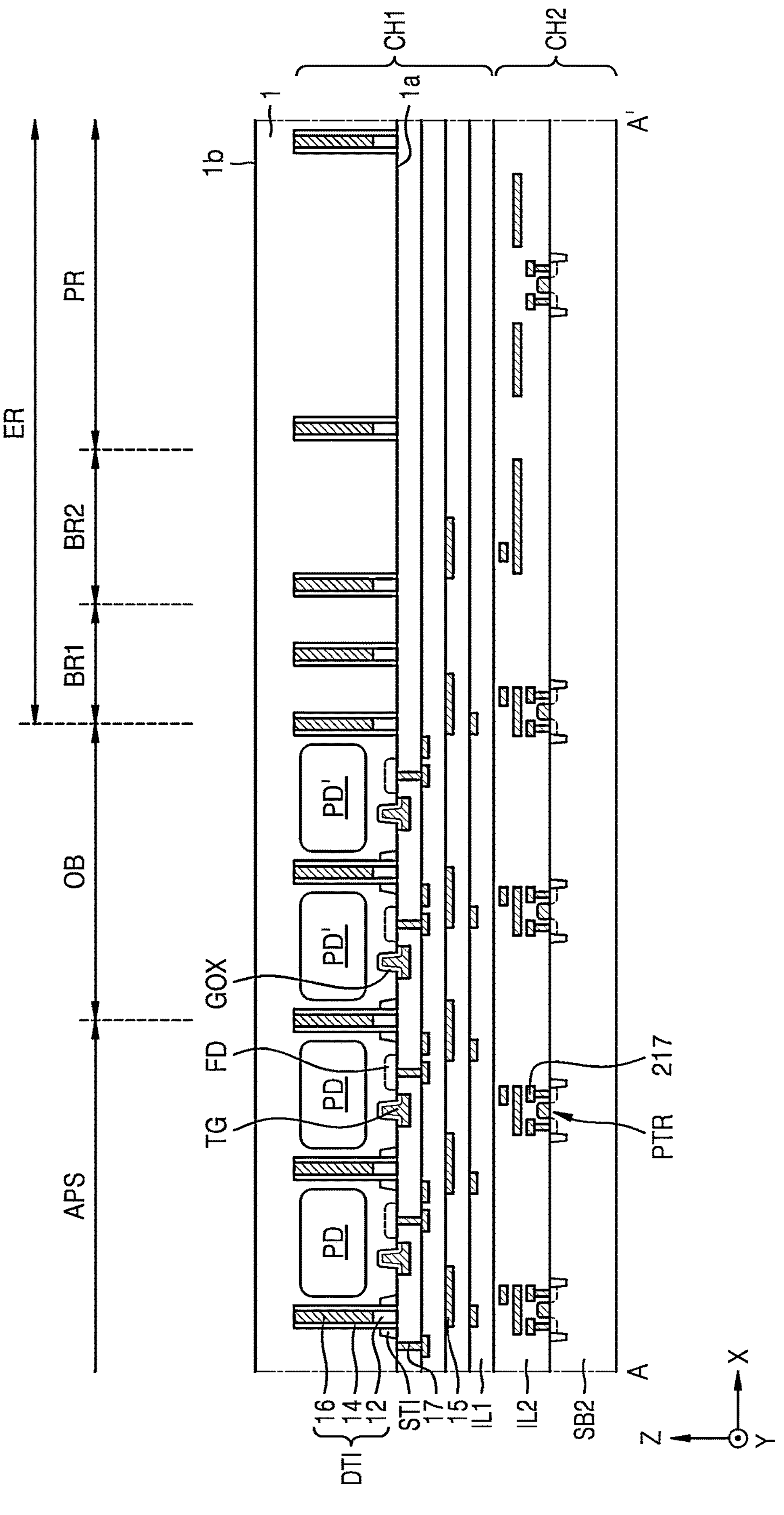
FIGS. 9, 10, 11, 12, 13, 14, 15, and 16 are cross-sectional views sequentially illustrating a manufacturing method of an image sensor according to embodiments.

Referring to FIG. 9, the first sub chip CH1 may be manufactured. To this end, firstly, the device isolators STI defining the active region, the pixel separator DTI defining a unit pixel region, and the photoelectric converter PD and the photodiode PD' may be formed in the first substrate 1 including the pixel array region APS and the edge region ER. The photoelectric converter PD and the photodiode PD' may be formed by using an ion implantation process. In the active region, transistors constituting the unit pixel UP may be formed. Thereafter, the first interlayer insulating layer IL1, the first contact plugs 17, and the first wirings 15 may be formed on the front surface 1*a* of the first substrate 1.

The second sub chip CH2 including the second substrate SB2, the second interlayer insulating layer IL2 on the second substrate SB2, and the second wirings and transistors PTR in the second interlayer insulating layer IL2 may be prepared. After the first interlayer insulating layer IL1 is aligned to contact the second interlayer insulating layers IL2, a thermal compression process or the like may be performed to bond the first sub chip CH1 on the second sub chip CH2.

Figure 10:
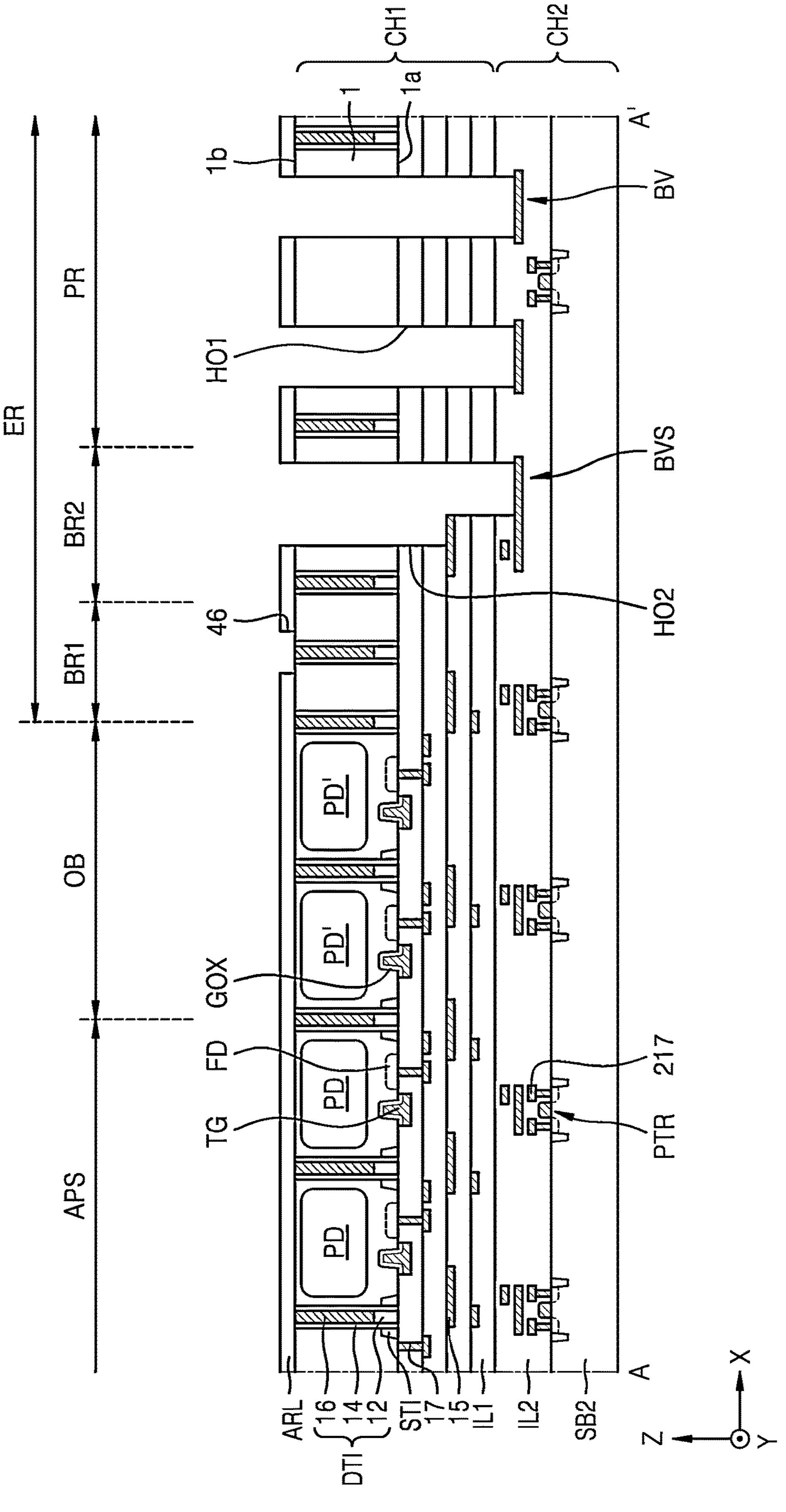

Referring to FIG. 10, in the state of FIG. 9, a grinding process, for example, a chemical mechanical polishing (CMP) process, may be performed on the back surface 1*b* of the first substrate 1 to obtain the thickness of the first substrate 1. In this case, the separation conductive patterns 16 of the pixel separators DTI may be exposed. After the grinding process, the anti-reflection structure ARL covering or overlapping the back surface 1*b* of the first substrate 1 may be formed.

On the back surface 1*b* of the first substrate 1, the first back surface trench 46 on which the back surface contact BCA is to be formed, the first holes HO1 in which the back surface vias BV are to be formed, and the second holes HO2 in which the back surface contacts BCA are to be formed, may be formed. The first back surface trench 46, the first holes HO1, and the second holes HO2 may penetrate or extend into the anti-reflection structure ARL. Some separation conductive patterns 16 of the pixel separators DTI may be exposed by the first back surface trench 46. Some of the second wirings 217 may be exposed by the first holes HO1. Sone of the first wirings 15 and some of the second wirings 217 may be exposed by the second holes HO2.

Figure 11:
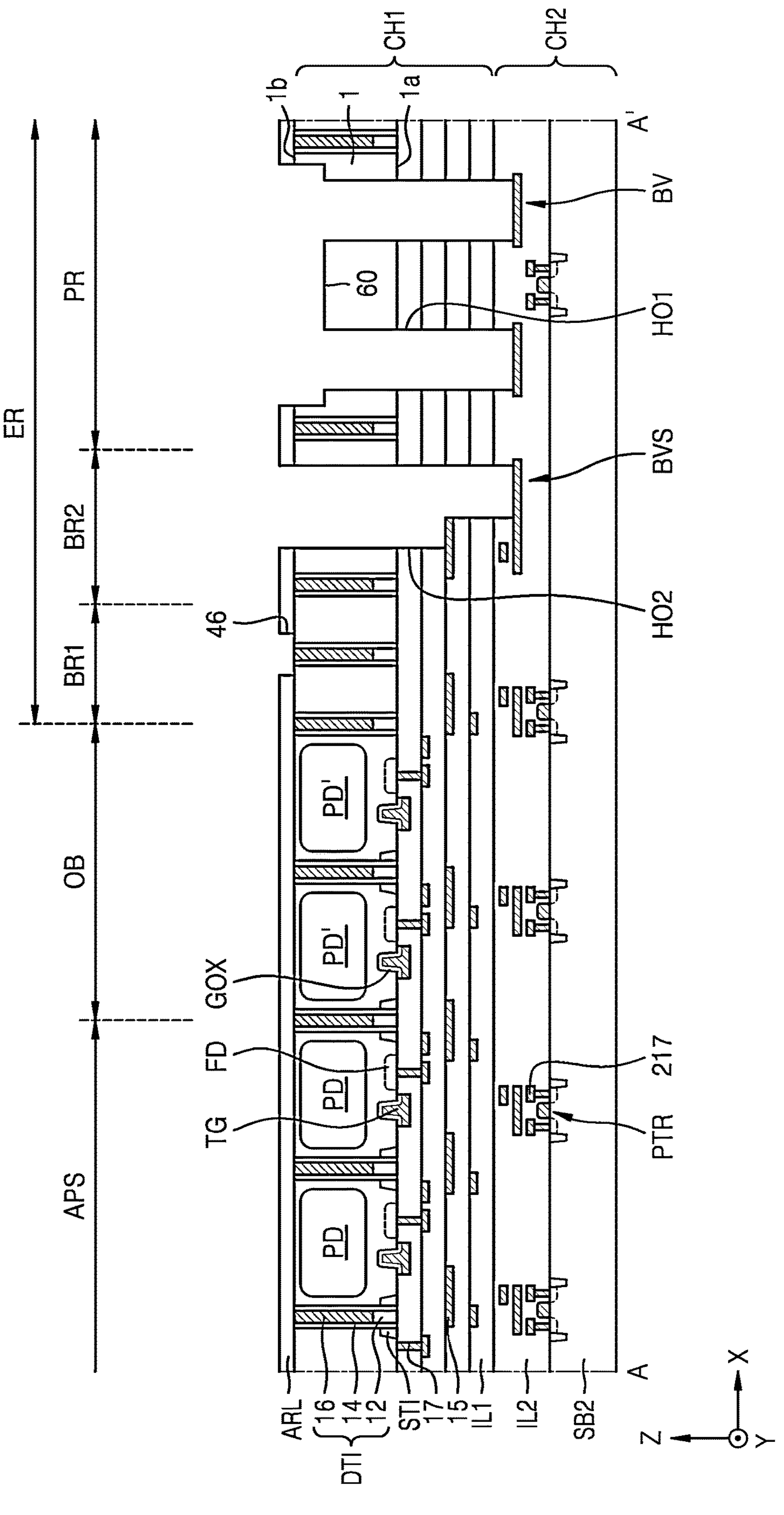

Referring to FIG. 11, the second back surface trench 60 may be formed in the pad region PR. In a plan view, the first holes HO1 may be arranged in the second back surface trench 60.

Figure 12:
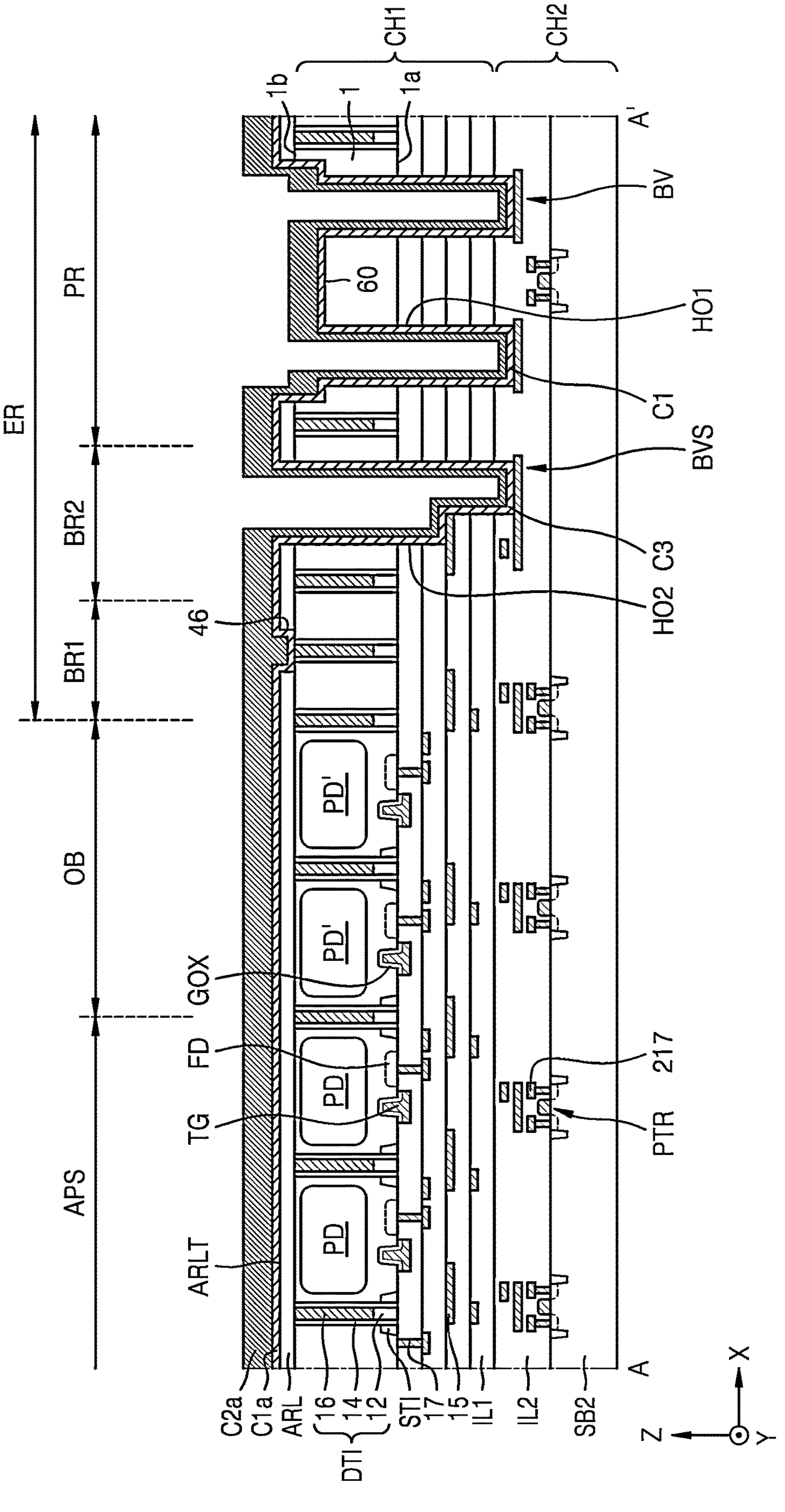

Referring to FIG. 12, a first conductive layer C1*a* and a second conductive layer C2*a* may be formed. The first conductive layer C1*a* may extend from the pixel array region APS to the edge region ER via the light-blocking region OB. The first conductive layer C1*a* may cover or overlap the upper surface ARLT of the anti-reflection structure ARL, the inner sidewalls and bottom surfaces of the first back surface trench 46, the inner sidewalls and bottom surfaces of the second holes HO2, the sidewalls 60S and bottom surfaces of the second back surface trench 60, and the inner sidewalls and bottom surfaces of the first holes HO1. The second conductive layer C2*a* may cover or overlap a surface of the first conductive layer C1*a*. The second conductive layer C2*a* may be formed to be thicker on an upper surface of a component than on inner walls of the component. The first conductive layer C1*a* may have a multilayered structure. The first conductive layer C1*a* may include a barrier metal layer and a metal layer. The second conductive layer C2*a* may include titanium, aluminum, and/or titanium nitride.

Figure 13:
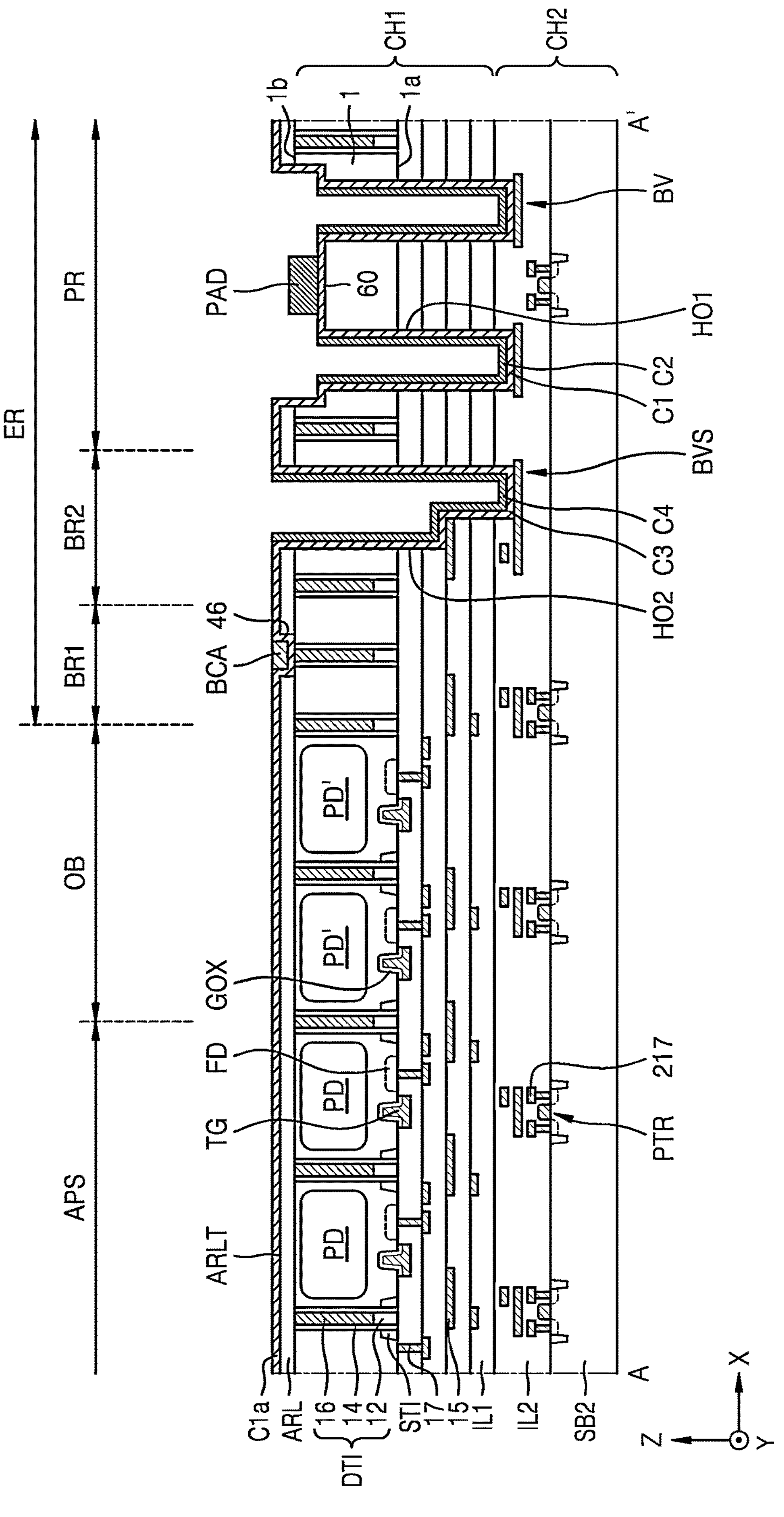

Referring to FIG. 13, an etching process may be performed on the second conductive layer C2*a* to form, from the second conductive layer C2*a*, the second conductive pattern C2, the fourth conductive pattern C4, the back surface contacts BCA, and the back surface conductive pad PAD. The second conductive pattern C2 may cover or overlap the inner sidewalls/inner surfaces and the bottom surface of the first conductive layer C1*a* in the first hole HO1. The fourth conductive pattern C4 may cover or overlap the inner sidewalls and the bottom surface of the first conductive layer C1*a* in the second hole HO2. The back surface conductive pad PAD may be arranged on the bottom surface of the second back surface trench 60 and on the first conductive layer C1*a*. The back surface contact BCA may cover or overlap the inner sidewalls and the bottom surface of the first conductive layer C1*a* in the first back surface trench 46.

Figure 14:
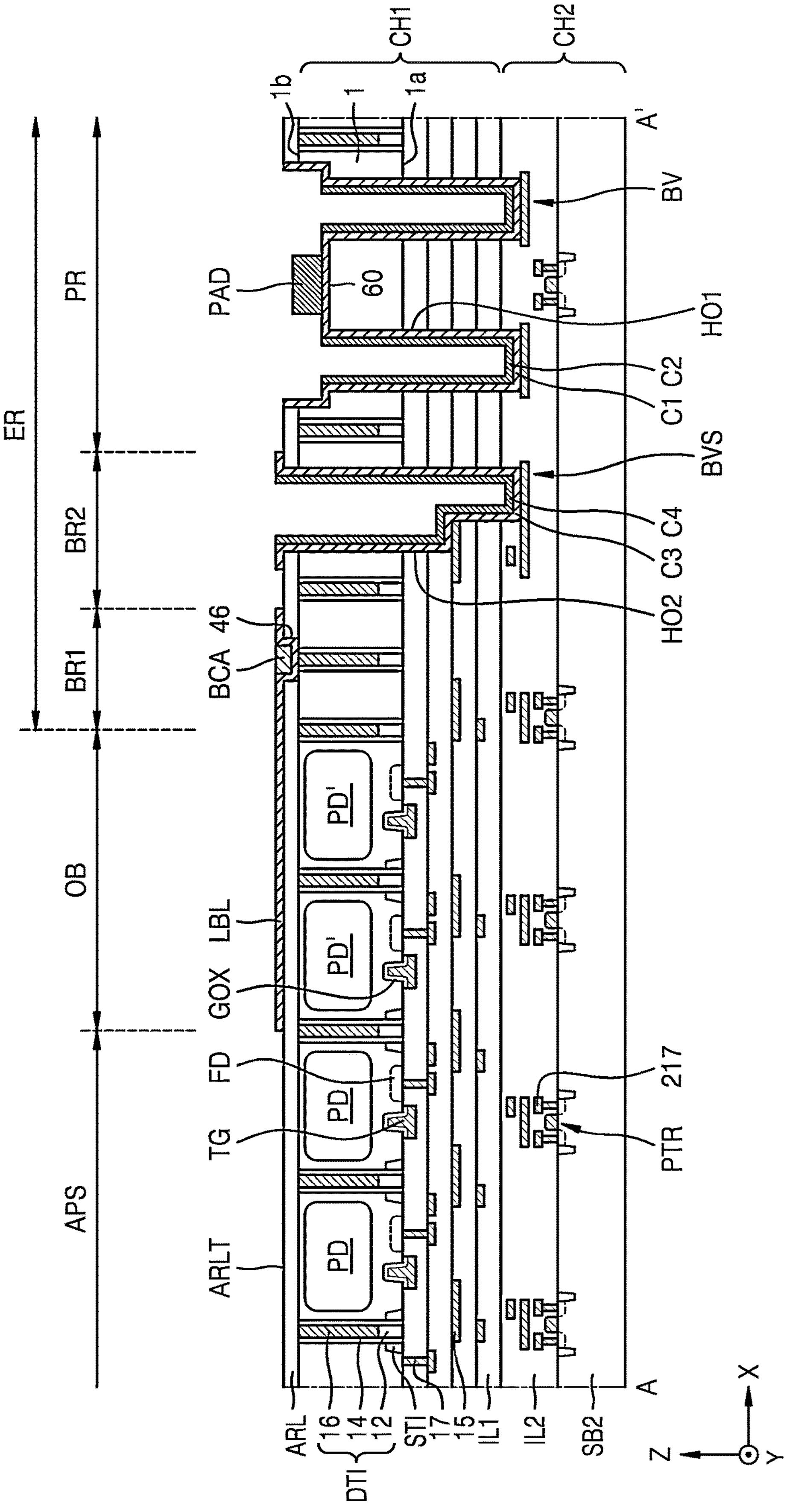

Referring to FIG. 14, by performing an etching process on the first conductive layer C1*a*, the first conductive pattern C1, the third conductive pattern C3, and the light-blocking structure LBL may be formed from the first conductive layer C1*a*.

Figure 15:
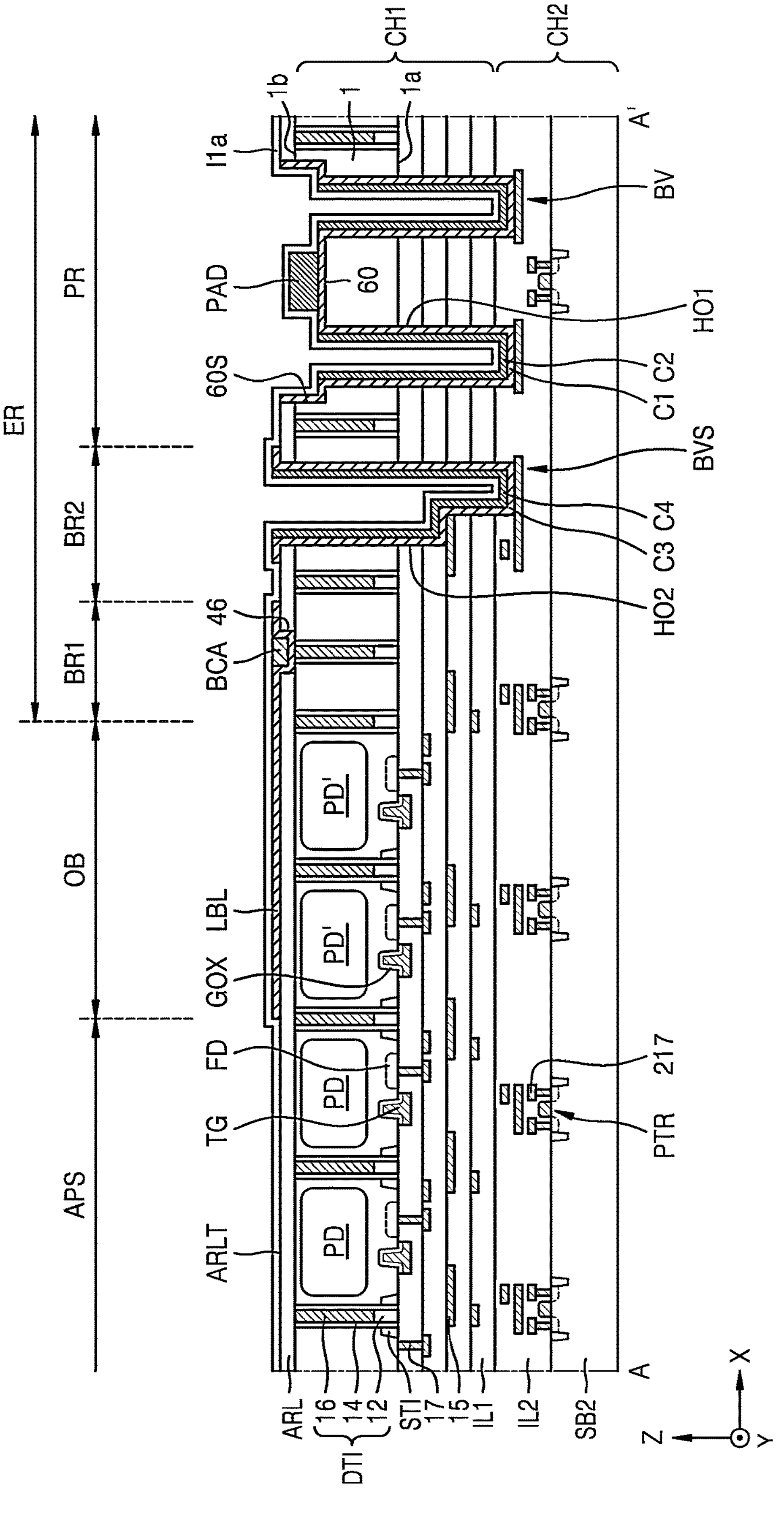

Referring to FIG. 15, a preliminary insulating layer I1*a* may be formed on the frontside surface of the first substrate 1. The preliminary insulating layer I1*a* may cover or overlap the upper surface ARLT of the anti-reflection structure ARL in the pixel array region APS and the back surface via stack region BR2. The preliminary insulating layer I1*a* may cover or overlap upper surfaces of the light-blocking structure LBL and the back surface contacts BCA in the light-blocking region OB and the contact region BR1. The preliminary insulating layer I1*a* may cover or overlap a surface of the fourth conductive pattern C4 in the second hole HO2. The preliminary insulating layer I1*a* may cover or overlap the surface of the second conductive pattern C2 in the first hole HO1. The preliminary insulating layer I1*a* may extend to the sidewalls and the upper surface of the back surface conductive pad PAD and to the sidewalls 60S of the second back surface trench 60.

Figure 16:
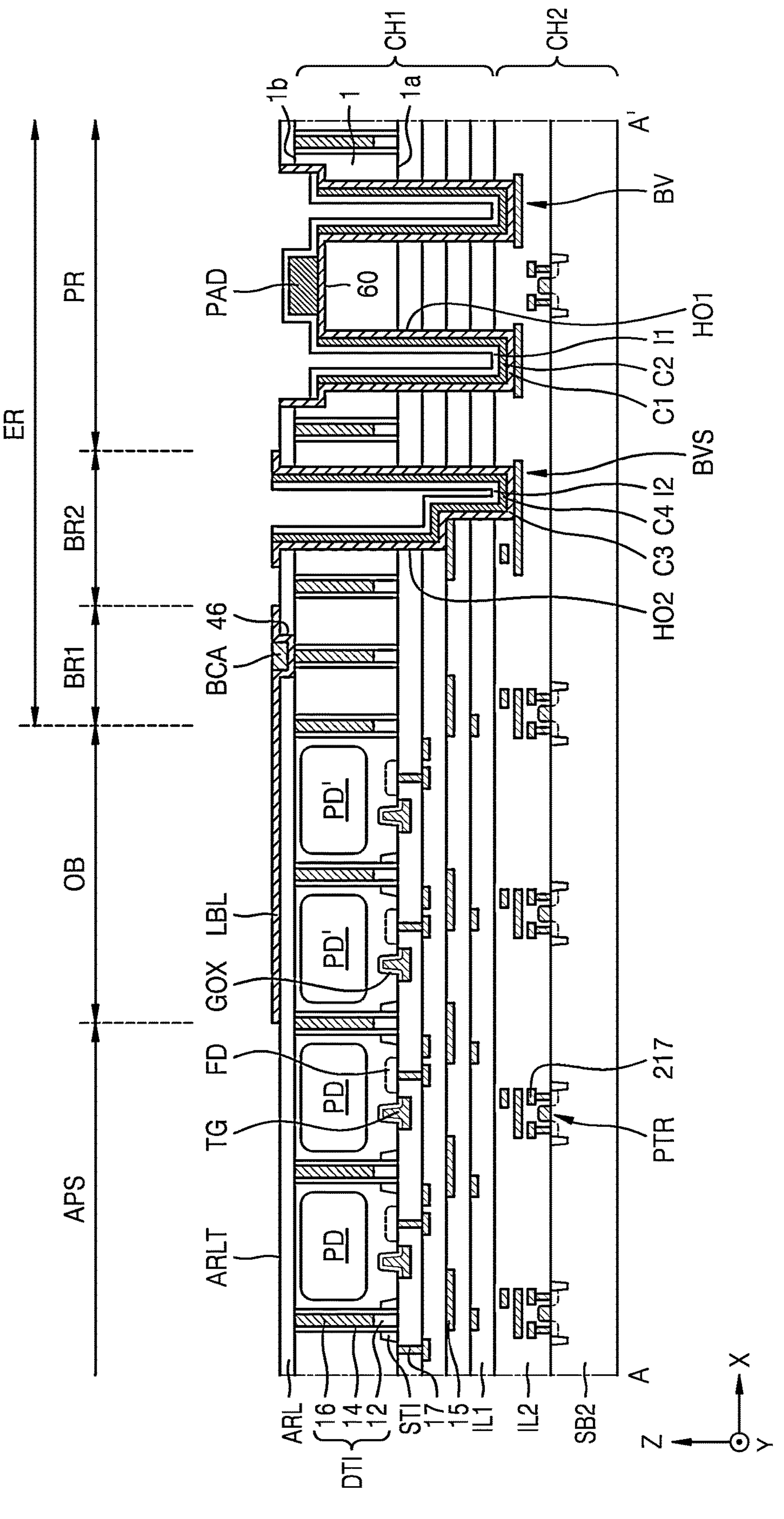

Referring to FIG. 16, by performing an etching process on the preliminary insulating layer I1*a*, the first insulating layer I1 and the second insulating layer 12 may be formed from the preliminary insulating layer I1*a*.

Referring to FIG. 5 again, a grid pattern may be formed on the pixel array region APS. The grid pattern may be formed by depositing a Ti/TiN/LK multilayer on the light-blocking grid pattern 48 and the low refractive grid pattern 50, and patterning the deposited multilayer. In this case, the LK may mean a low refractive index material. The grid pattern may be arranged to vertically overlap the pixel separator DTI. On the other hand, the LK may fill the inside of the first holes HO1 and the inside of the second holes HO2. Thereafter, the protection layer 56 may be formed in the pixel array region APS and the light-blocking region OB, and the first capping pattern CAP1 and the second capping pattern CAP2 may be formed by using q negative photoresistor.

The color filter CF may be formed in the pixel array region APS, and at the same time, the filter residual layer CFR may be formed in the light-blocking region OB and the edge region ER. Thereafter, the micro lens ML may be formed in the pixel array region APS, and the lens residual layer MLR may be formed in other regions except for the pixel array region APS. Thereafter, in the pad region PR, by removing the lens residual layer MLR, the filter residual layer CFR, and the first insulating layer I1, the opening 35 exposing the back surface conductive pad PAD may be formed.

Figure 17:
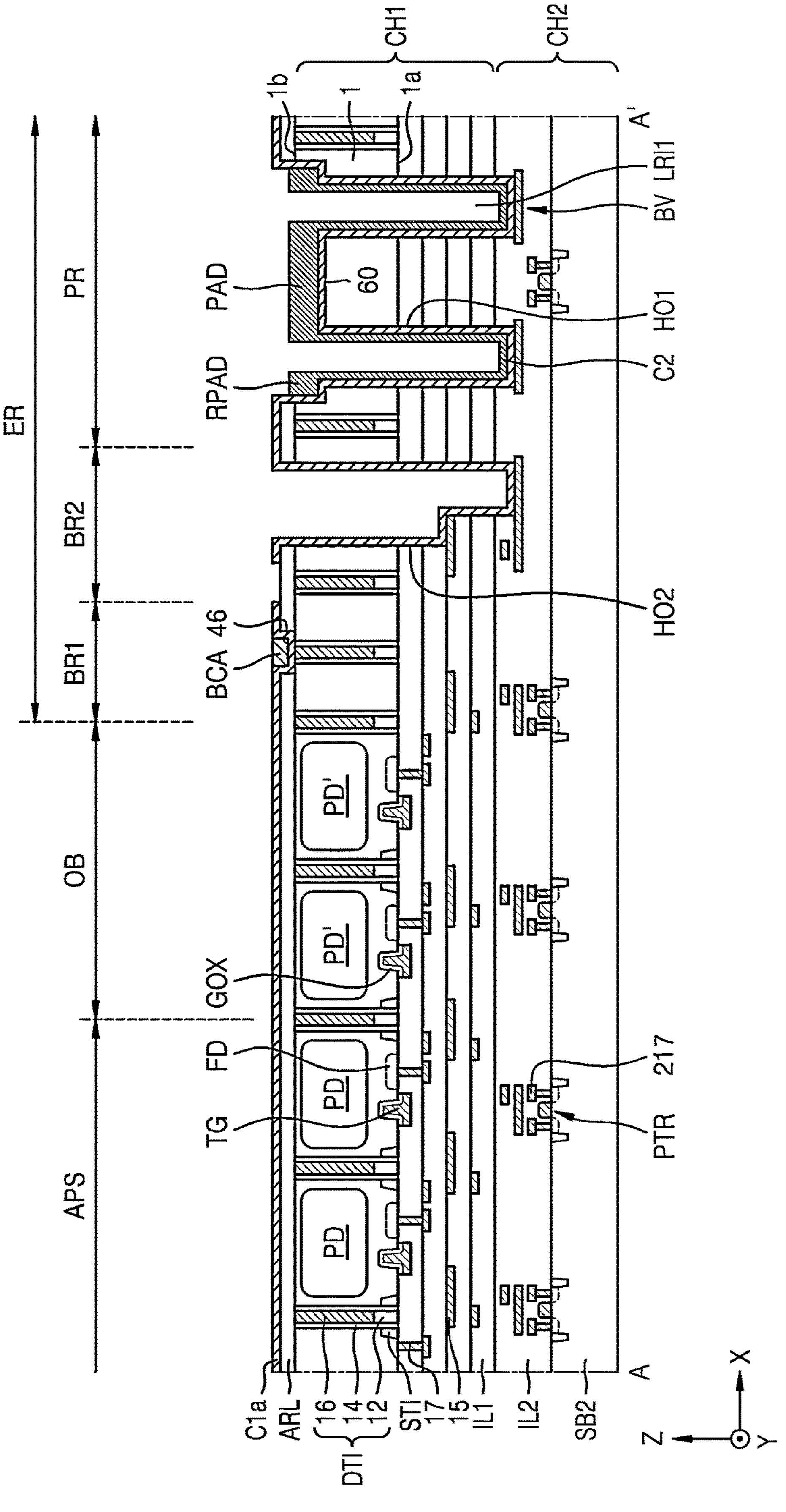
FIG. 17 is a cross-sectional view illustrating a manufacturing method of an image sensor according to an embodiment.

FIG. 17 is a cross-sectional view illustrating a manufacturing method of an image sensor 101 according to an embodiment. Referring to FIG. 17, a manufacturing method of the image sensor 101 described with reference to FIGS. 7 and 8 is described.

Firstly, after performing the same processes as the manufacturing process up to FIG. 12, an etching process may be performed on the second conductive layer C2*a*. By using an etching process on the second conductive layer C2*a*, the back surface contacts BCA, the second conductive pattern C2, the back surface conductive pad PAD, and the residual conductive pad RPAD may be formed from the second conductive layer C2*a*. Both the back surface conductive pad PAD and the residual conductive pad RPAD may be arranged in the second back surface trench 60. The back surface conductive pad PAD may be connected to the residual conductive pad RPAD via the second conductive pattern C2.

Thereafter, by performing the same processes as the manufacturing processes described with reference to FIGS. 14 through 16 and 5, the image sensor 101 of FIG. 17 may be manufactured.

While the present disclosure has been particularly shown and described with reference to embodiments thereof, it will be understood that various changes in form and details may be made therein without departing from the spirit and scope of the following claims.

What is claimed is:

1. An image sensor comprising:

a substrate that comprises a first surface and a second surface that faces the first surface, wherein the substrate comprises a pixel array region, a light-blocking region that at least partially surrounds the pixel array region, and a pad region that at least partially surrounds the light-blocking region;

a back surface trench that is in the pad region and extends from the second surface toward the first surface of the substrate;

a back surface conductive pad in the back surface trench; and a first back surface via that is in the back surface trench and in a first hole that is spaced apart from the back surface conductive pad in a horizontal direction, wherein the first back surface via comprises a first conductive pattern on an inner sidewall of the first hole and a second conductive pattern on the first conductive pattern.

2. The image sensor of claim 1, wherein the first conductive pattern extends to a bottom surface of the back surface trench.

3. The image sensor of claim 2, wherein the first conductive pattern extends to sidewalls of the back surface trench.

4. The image sensor of claim 3, wherein a height of an upper surface of the first conductive pattern from the first surface of the substrate is greater than a height of an upper surface of the back surface conductive pad from the first surface of the substrate.

5. The image sensor of claim 1, wherein the second conductive pattern and the back surface conductive pad comprise an identical material.

6. The image sensor of claim 1, wherein:

the first back surface via further comprises an insulating layer on the second conductive pattern, and the insulating layer extends to sidewalls of the back surface conductive pad.

7. The image sensor of claim 6, wherein a height of an upper surface of the insulating layer from the first surface of the substrate is greater than or equal to a height of an upper surface of the back surface conductive pad from the first surface of the substrate.

8. The image sensor of claim 1, further comprising a second back surface via that is in the back surface trench and in a second hole that is spaced apart from the back surface conductive pad and the first back surface via in the horizontal direction, wherein the first conductive pattern extends to an inner sidewall and a bottom surface of the second hole.

9. The image sensor of claim 8, wherein a distance between the first hole and the second hole in the horizontal direction is greater than a width of the back surface conductive pad in the horizontal direction.

10. The image sensor of claim 1, further comprising a residual conductive pad that is in the back surface trench and spaced apart from the back surface conductive pad in the horizontal direction, wherein the residual conductive pad is electrically connected to the back surface conductive pad and the second conductive pattern.

11. The image sensor of claim 10, further comprising a second back surface via that is in a second hole and in the back surface trench, wherein:

the second back surface via is spaced apart from the back surface conductive pad and the first back surface via in the horizontal direction, and a distance between the first hole and the second hole in the horizontal direction is less than a width of the back surface conductive pad in the horizontal direction.

12. The image sensor of claim 10, wherein:

the first back surface via further comprises an insulating layer on the second conductive pattern, and the insulating layer extends to an upper surface of the residual conductive pad.

13. The image sensor of claim 12, further comprising a reflection prevention structure that is on the second surface of the substrate and in each of the pixel array region and the light-blocking region, wherein a height of an upper surface of the insulating layer from the first surface of the substrate is substantially identical to a height of an upper surface of the reflection prevention structure from the first surface of the substrate.

14. The image sensor of claim 10, wherein the residual conductive pad, the second conductive pattern, and the back surface conductive pad comprise an identical material.

15. An image sensor comprising:

a first substrate comprising a first transistor;

a first wiring that is electrically connected to the first transistor;

a second substrate comprising a second transistor, wherein the second substrate comprises a first surface that is adjacent to the first substrate and a second surface that faces the first surface;

a second wiring that is electrically connected to the second transistor;

a back surface via in a first hole that extends into the second substrate, wherein the back surface via is electrically connected to the first wiring; and a back surface via stack in a second hole that extends into the second substrate, wherein the back surface via stack is electrically connected to the first wiring and the second wiring, wherein the back surface via comprises a first conductive pattern on an inner sidewall of the first hole, wherein the back surface via stack comprises a second conductive pattern on an inner sidewall of the second hole, wherein the first conductive pattern and the second conductive pattern comprise an identical material, and wherein a height of an upper surface of the first conductive pattern from the first surface of the second substrate is less than a height of an upper surface of the second conductive pattern from the first surface of the second substrate.

16. The image sensor of claim 15, further comprising a back surface conductive pad on the upper surface of the first conductive pattern, wherein the back surface conductive pad is electrically connected to the first conductive pattern.

17. The image sensor of claim 16, wherein:

the back surface via further comprises a third conductive pattern on the first conductive pattern, the back surface via stack further comprises a fourth conductive pattern on the second conductive pattern, and the third conductive pattern, the fourth conductive pattern, and the back surface conductive pad comprise an identical material.

18. The image sensor of claim 17, wherein the third conductive pattern is electrically connected to the back surface conductive pad.

19. An image sensor comprising:

a substrate comprising a front surface and a back surface that faces the front surface, wherein the substrate comprises a pixel array region, a light-blocking region that at least partially surrounds the pixel array region, and a pad region that at least partially surrounds the light-blocking region;

photoelectric converters in the pixel array region;

color filters on the photoelectric converters, respectively;

microlenses on the color filters, respectively;

a filter residual layer that is on the front surface of the substrate and in the light-blocking region, wherein the filter residual layer and the color filters comprise an identical material;

a lens residual layer that is on the filter residual layer, wherein the lens residual layer and the microlenses comprise an identical material;

a back surface trench that is in the pad region and extends from the front surface toward the back surface of the substrate;

a back surface conductive pad in the back surface trench; and a back surface via in the back surface trench and in a hole that is spaced apart from the back surface conductive pad in a horizontal direction.

20. The image sensor of claim 19, wherein:

the back surface via comprises a first conductive pattern on an inner side wall of the hole and a second conductive pattern on the first conductive pattern, and a height of an upper surface of the first conductive pattern from the front surface of the substrate is greater than a height of an upper surface of the second conductive pattern from the front surface of the substrate.

* * * * *